(12) United States Patent
Dewan et al.

(10) Patent No.: US 12,355,460 B2
(45) Date of Patent: Jul. 8, 2025

(54) CALIBRATION IN NON-LINEAR MULTI-STAGE DELAY-TO-DIGITAL CONVERSION CIRCUITS

(71) Applicant: Texas Instruments Incorporated, Dallas, TX (US)

(72) Inventors: Sourya Dewan, Bangalore (IN); Visvesvaraya Appala Pentakota, Bangalore (IN); Rishi Soundararajan, Bangalore (IN); Shagan Dusad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 98 days.

(21) Appl. No.: 18/174,187

(22) Filed: Feb. 24, 2023

(65) Prior Publication Data
US 2024/0171190 A1    May 23, 2024

(30) Foreign Application Priority Data
Nov. 22, 2022 (IN) .............................. 202241066926

(51) Int. Cl.
*H03M 1/10* (2006.01)
(52) U.S. Cl.
CPC ................ *H03M 1/1014* (2013.01)
(58) Field of Classification Search
CPC .................................................. H03M 1/1014
USPC ........................................................ 341/120
See application file for complete search history.

(56) References Cited

U.S. PATENT DOCUMENTS

| | | | |
|---|---|---|---|
| 10,173,453 B2 * | 1/2019 | Cape | B42D 25/405 |
| 10,673,452 B1 | 6/2020 | Soundararajan et al. | |
| 10,673,453 B1 | 6/2020 | Pentakota et al. | |
| 10,673,456 B1 * | 6/2020 | Dusad | H03M 1/206 |
| 10,778,243 B2 | 9/2020 | Pentakota et al. | |
| 11,316,525 B1 | 4/2022 | Pentakota et al. | |
| 11,316,526 B1 * | 4/2022 | Rajagopal | H03M 1/502 |
| 11,346,526 B1 | 4/2022 | Rajagopal et al. | |
| 2022/0247420 A1 * | 8/2022 | Rajagopal | H03M 1/0836 |

OTHER PUBLICATIONS

U.S. Appl. No. 17/898,844, filed Aug. 30, 2022, entitled "Multi-Bit Voltage-to-Delay Conversion in Data Converter Circuitry".

* cited by examiner

*Primary Examiner* — Jean B Jeanglaude
(74) *Attorney, Agent, or Firm* — Mandy Barsilai Fernand; Frank D. Cimino

(57) ABSTRACT

A delay-domain analog-to-digital converter including a voltage-to-delay circuit and a time-to-digital converter circuit, and a method of calibrating the same. The voltage-to-delay circuit generates a delay signal based on applied calibration voltage, and the delay signal is applied to a first residue stage configured to generate a sign bit and a residue delay signal. The residue delay signal is applied to an input of a successive residue stage, which is configured to generate a sign bit and provide a residue delay signal to inputs of a next successive residue stage. First and second trim circuits are provided in a delay comparator of one of the successive residue stages, and configured to adjust a first response of the residue stage for a calibration voltage in a first range, and to adjust a second response of the residue stage for a calibration voltage in a second range.

19 Claims, 16 Drawing Sheets

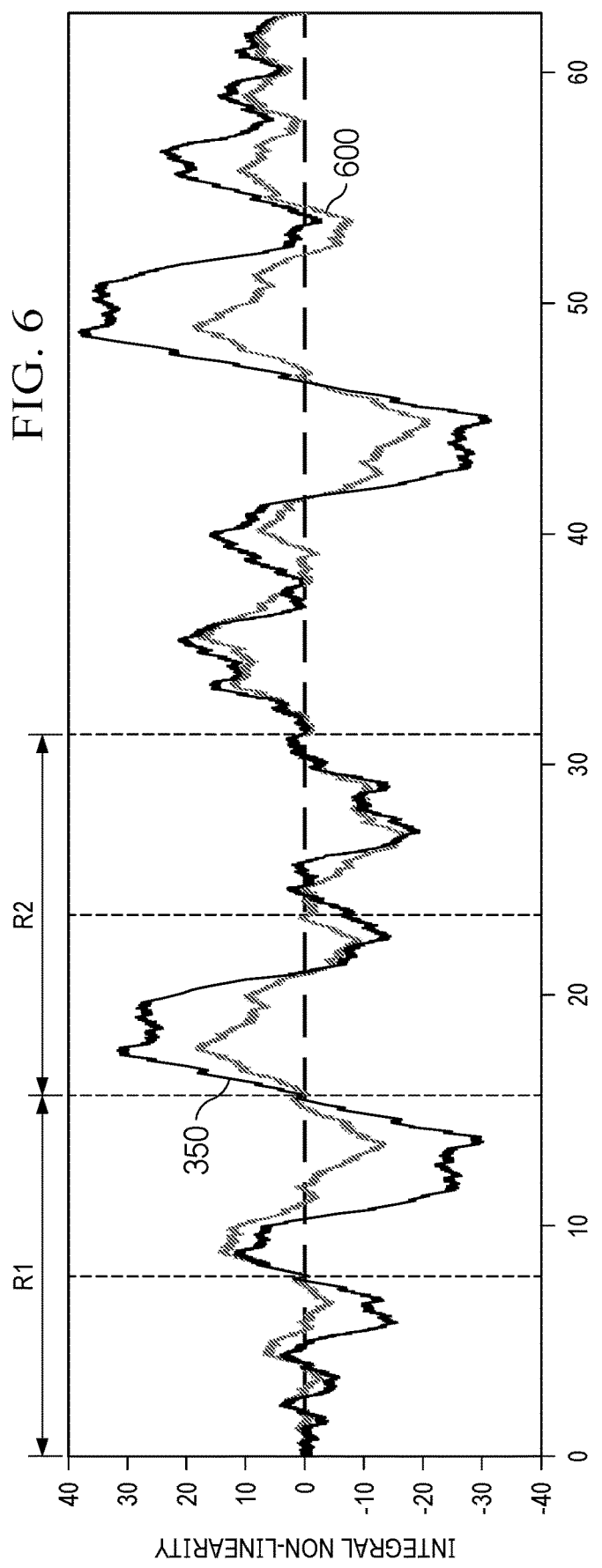

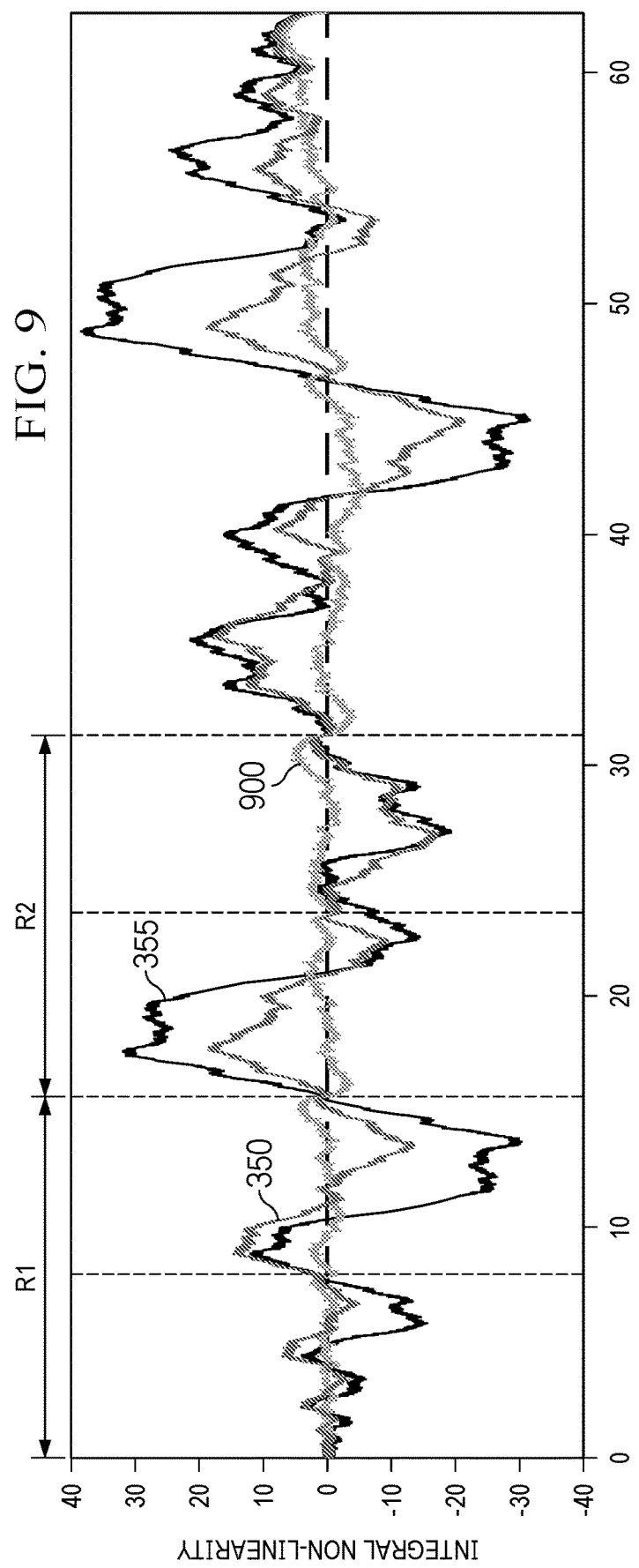

CALIBRATION IN NON-LINEAR MULTI-STAGE DELAY-TO-DIGITAL CONVERSION CIRCUITS

CROSS-REFERENCE TO RELATED APPLICATIONS

This application claims priority, under 35 U.S.C. § 119(a), of Indian Patent Application No. 202241066929, filed Nov. 22, 2022.

BACKGROUND

This relates to analog-to-digital converters, and more particularly relates to analog-to-digital converters that operate in part in the delay domain.

Analog-to-digital converter (ADC) circuits generate digital words or codes to represent levels of an input analog signal. One type of ADC is referred to as a "pipeline" ADC. A "pipeline" ADC includes a sequence of consecutive stages. Each stage evaluates one or two bits of the output word and forwards a "residue" to a next stage, which resolves the next one or two less significant bits, and so on.

In system applications such as a radio-frequency (RF) sampling receiver, the input ADC is called upon to digitize a high frequency analog signal, and must therefore operate at a high sampling rate. Due to architectural constraints, some pipeline ADCs may be limited in operating speed, and thus may not be suited for use in RF-sampling receivers.

To address this limitation of pipeline ADCs, a type of ADCs referred to as a "time-domain" or "delay-domain" ADC has been developed. A delay domain ADC includes a voltage-to-delay (V2D) component and a time-to-digital converter (TDC) component. The V2D component expresses the received input voltage in terms of a signal delay. The TDC component converts the signal delay expression from the V2D portion into a digital code word. Examples of delay-domain analog-to-digital converters are described in U.S. Pat. Nos. 10,673,452; 10,673,456; 10,673,453; 10,778,243; 11,316,525; and 11,316,526, all of which are commonly assigned herewith and incorporated herein by reference in their entirety. Delay-domain analog-to-digital converters can be capable of high speed operation, and with reduced area and power requirements as compared with traditional pipelined ADCs.

FIG. 1A illustrates a delay comparator 110, as may be implemented in a residue stage of a pipelined TDC portion of a delay-domain ADC that also includes calibration circuitry. Delay comparator 110 includes a time-domain comparator 112, a voltage barrier circuit 114, a variable trim capacitor 120, and transistors 116 and 117. Voltage barrier circuit 114 includes transistors 113P, 113M, 115P, and 115M.

Time-domain comparator 112 has inputs Vinp, Vinm, and outputs Vop, Vom. Inputs Vinp, Vinm coupled to residue signal lines A[i−1], B[i−1] from a previous residue stage. Time-domain comparator 112 operates to present a differential voltage at its outputs Vop, Vom according to a function of the delay between the two rising edge transitions at its inputs Vinp, Vinm. For example, in response to a rising edge at input Vinm leading that at input Vinp, time-domain comparator 112 will drive its output Vom toward circuit ground and maintain its output Vop at or near the VDD power supply voltage. Conversely for the example of a rising edge at input Vinp leading that at input Vinm, time-domain comparator 112 will drive its output Vop toward circuit ground and maintain its output Vom at or near the VDD power supply voltage.

Outputs Vop, Vom are connected to n-channel metal-oxide-semiconductor (NMOS) transistors 115M, 115P, respectively, in voltage barrier circuit 114. NMOS transistors 115P and 115M have their drains coupled to intermediate node VB_out, and their gates cross-coupled to the source of the other. Intermediate node VB_out is coupled to drains of PMOS reset transistors 113P and 113M. Transistors 113P and 113M have their sources biased to the VDD power supply, and their gates coupled to inputs Vinp, Vinm, respectively. Intermediate node VB_out (at an output of voltage barrier circuit 114) is coupled to the gate of PMOS transistor 116 in an output stage of delay comparator 110. PMOS transistor 116 has a source at the VDD power supply and a drain connected to the drain of NMOS reset transistor 117, at output signal line A[i]. NMOS reset transistor 117 has its source at circuit ground and its gate receiving a reset signal RST to reset line A[i] to a low level between conversion operations.

Variable trim capacitor 120 in the delay comparator 110 is coupled between intermediate node VB_out and circuit ground. The capacitance of variable trim capacitor 120 may be controlled by a digital calibration word, for example from digital circuitry in the ADC. The response of delay comparator 110 slows with an increase of the capacitance of variable trim capacitor 120, and the response of delay comparator 110 speeds up with a decrease of that capacitance.

In operation, intermediate node VB_out is reset to VDD in response to inputs Vinp, Vinm being at a low logic level (e.g., between conversion operations). Voltage barrier 114 responds to a differential voltage driven at outputs Vop, Vom of time-domain comparator 112 by one of NMOS transistors 115P, 115M turning on in response to that differential voltage. The one of NMOS transistors 115P, 115M that is turned on by the differential voltage from time-domain comparator 112 pulls intermediate node VB_out toward the voltage at its source. This turns on PMOS transistor 116 in the output stage to drive a low-to-high transition at residue signal line A[i].

FIG. 1B illustrates a logic function 130 that may be included with conventional delay comparator 110 in a residue stage. In this example, conventional logic function 130 operates as an AND function. Logic function 130 includes NAND gate 132, a variable trim capacitor 140, and transistors 134 and 136.

NAND gate 132 has inputs Vinp, Vinm coupled to residue signal lines A[i−1], B[i−1] from the previous residue stage in the pipeline. The output signal from NAND gate 132 is communicated on signal line Vout_NAND to the gate of PMOS transistor 134, in an output stage. PMOS transistor 134 has its source at VDD and its drain connected to the drain of NMOS reset transistor 136, at output residue signal line B[i]. NMOS reset transistor 136 receives reset signal RST at its gate, and has its source at circuit ground.

Output residue signal line B[i] is initially reset to ground between conversions (reset signal RST at a high level), and is driven to a high logic level by PMOS transistor 134 in response to both input residue signal lines A[i−1], B[i−1] being at a high level. This occurs upon the later of residue signal lines A[i−1], B[i−1] making a low-to-high transition. Similarly as conventional delay comparator 110, calibration of conventional logic function 130 is effected by variable trim capacitor 140 coupled between NAND output node Vout_AND and circuit ground. The response of logic function 130 can be adjusted by adjusting the capacitance of variable trim capacitor 140. For example, digital circuitry can adjust variable trim capacitor 140 by way of a calibration signal.

SUMMARY

In one example, an analog-to-digital converter that includes a voltage-to-delay circuit, a plurality of residue stages coupled in a sequence, and digital circuitry is provided. A first residue stage in the plurality of residue stages has inputs coupled to first and second outputs of the voltage-to-delay circuit, a sign bit output presenting a sign bit responsive to a relative delay between transitions at the first and second outputs of the voltage-to-delay circuit, and first and second residue outputs. A second residue stage in the sequence includes a logic gate and a delay comparator, each having inputs coupled to the first and second residue outputs of the first residue stage, and first and second residue outputs, respectively. The delay comparator in the second residue stage includes a time-domain comparator that generates a differential voltage responsive to a delay between signals at the first and second inputs of the delay comparator, a voltage barrier coupled to receive the differential voltage from the time-domain comparator, and having first and second intermediate outputs, and an output stage including a first transistor having a conductive path coupled between a bias voltage and the second residue output and having a control terminal coupled to the first intermediate output of the voltage barrier, and a second transistor having a conductive path coupled between the bias voltage and the second residue output and having a control terminal coupled to the second intermediate output of the voltage barrier. This second residue stage further includes a first trim circuit coupled to the first intermediate output of the voltage barrier, and an input coupled to the digital circuitry, and a second trim circuit coupled to the first intermediate output of the voltage barrier, and an input coupled to the digital circuitry.

In another example, a method of calibrating an analog-to-digital converter includes causing a voltage-to-delay device to generate a delay signal based on a calibration voltage. The method further includes, at a first residue stage and based on the delay signal, generating a sign bit and providing a residue delay signal to an input of a successive residue stage. The method further includes, at each of a plurality of successive residue stages, generating a sign bit and providing a residue delay signal to an input of a next successive residue stage, both of which are based on the residue signal at its input. The calibrating method further includes adjusting one or more of the successive residue stages by adjusting a first response of the residue stage at a first intermediate output for a calibration voltage in a first range, and adjusting a second response of the residue stage at a second intermediate output for a calibration voltage in a second range.

Examples of technical advantages enabled by one or more of these examples include an improvement in the accuracy of delay-domain analog-to-digital converters over the full input voltage range.

BRIEF DESCRIPTION OF THE DRAWINGS

FIG. 6 is an example comparison plot of integral non-linearity versus input voltage for an analog-to-digital converter of FIG. 2A and an analog-to-digital converter including the delay comparator of FIG. 1A and the AND logic function of FIG. 1B.

FIG. 9 is a comparison plot of integral non-linearity versus input voltage for an analog-to-digital converter according to the example of FIGS. 7A through 7C as compared with a analog-to-digital converter including the delay comparator of FIG. 1A and the AND logic function of FIG. 1B.

The same reference numbers or other reference designators are used in the drawings to illustrate the same or similar (in function and/or structure) features.

DETAILED DESCRIPTION

A source of error in delay domain ADCs stems from non-linearity in the time-to-digital conversion. In some implementations, the TDC component of the ADC is implemented in a pipelined fashion in which a sequence of stages each generate one or more digital bits from a delay between a pair of input signals and, based on a non-linear relationship, produces a residue delay signal for the next stage in the sequence. In some implementations that each successive stage may exhibit greater non-linearity than preceding stages. Calibration addresses his non-linear behavior in some delay domain ADCs, for example as described in the above-incorporated U.S. Pat. Nos. 11,316,525 and 11,316,526.

Figure 1A:
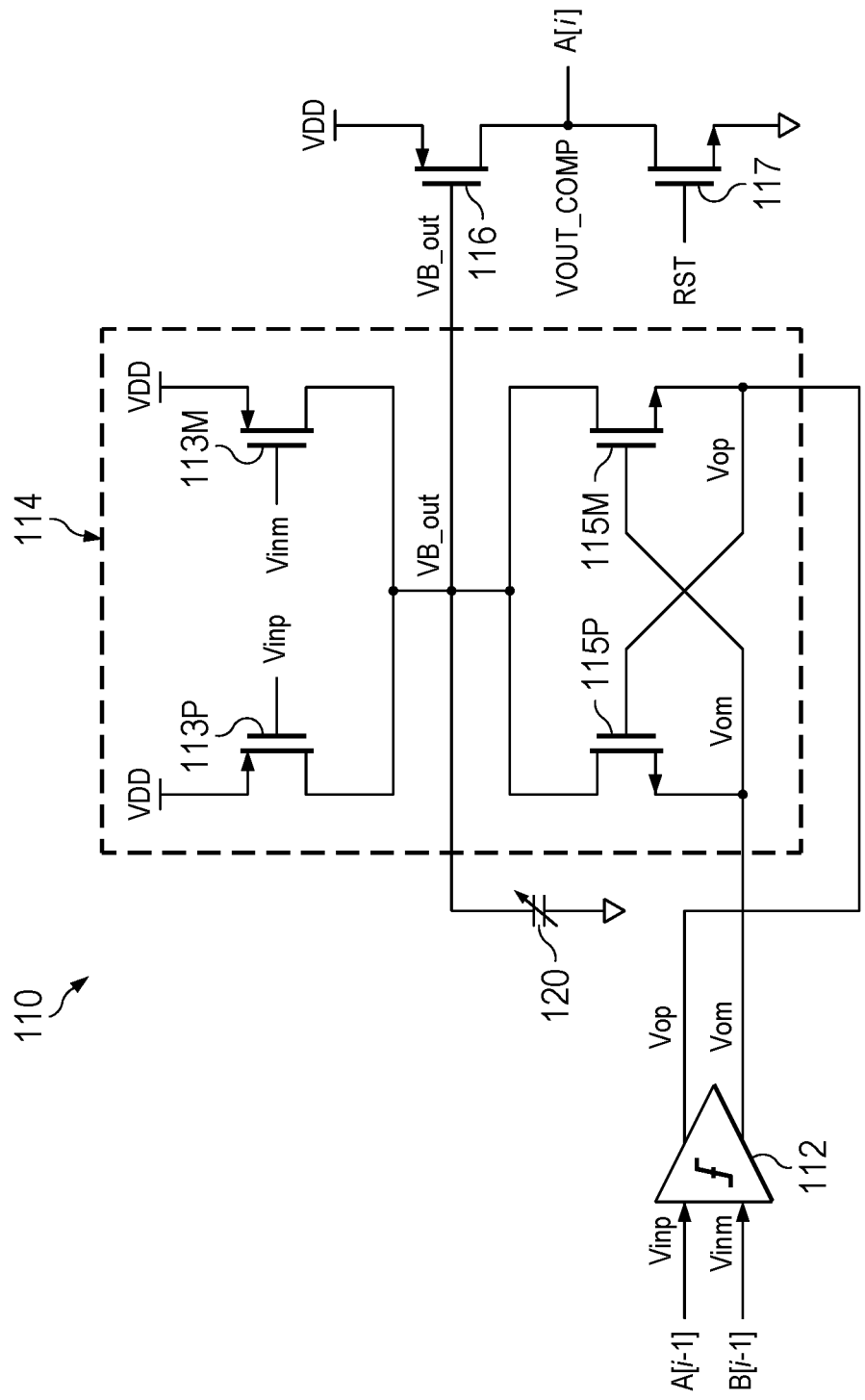
FIG. 1A is an electrical diagram, in schematic form, of a prior art delay comparator for a residue stage of an analog-to-digital converter.
Figure 1B:
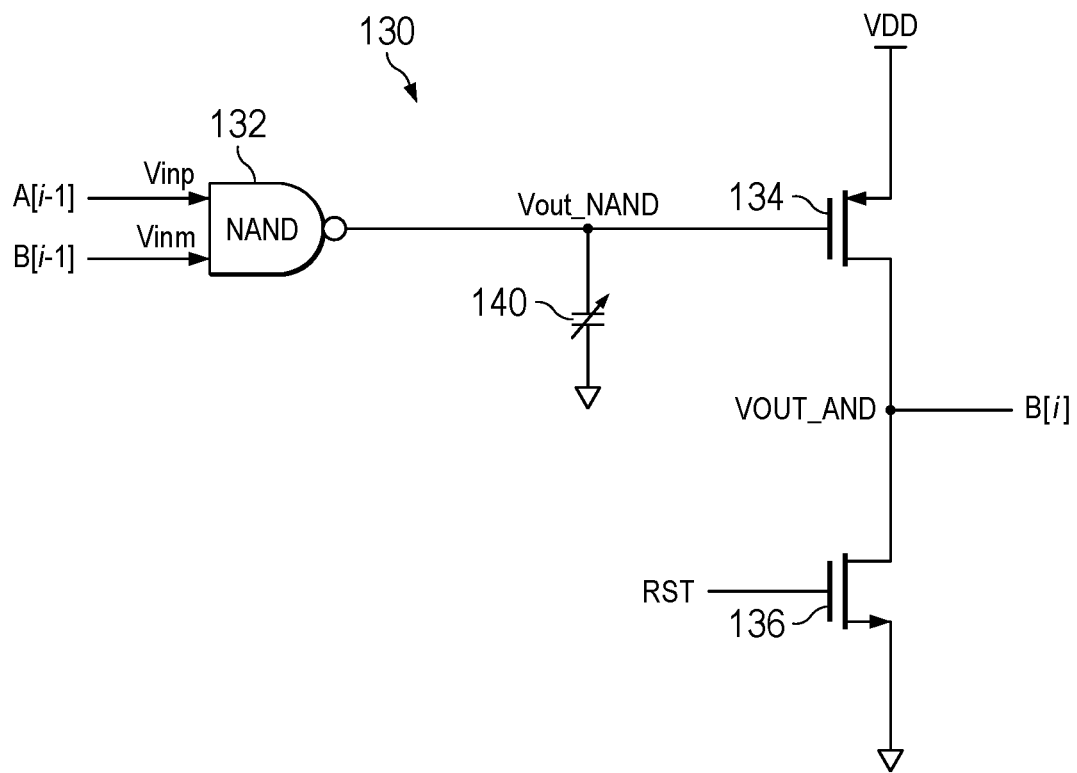
FIG. 1B is an electrical diagram, in schematic form, of a prior art AND logic function for a residue stage of an analog-to-digital converter.

For example, each of the pipelined residue stages in the TDC component of those ADCs includes a delay comparator such as delay comparator 110 of FIG. 1A and a logic function (e.g., an AND function) such as logic function 130 of FIG. 1B, both receiving a residue delay from a previous stage in the pipelined sequence. The delay comparator in each residue stage determines the value of a sign bit from the input residue delay, and the delay comparator and logic function each generate a transition at an associated output from the stage, where the relative delay between those transitions indicates a residue for application to the next stage in the pipeline.

Figure 1C:
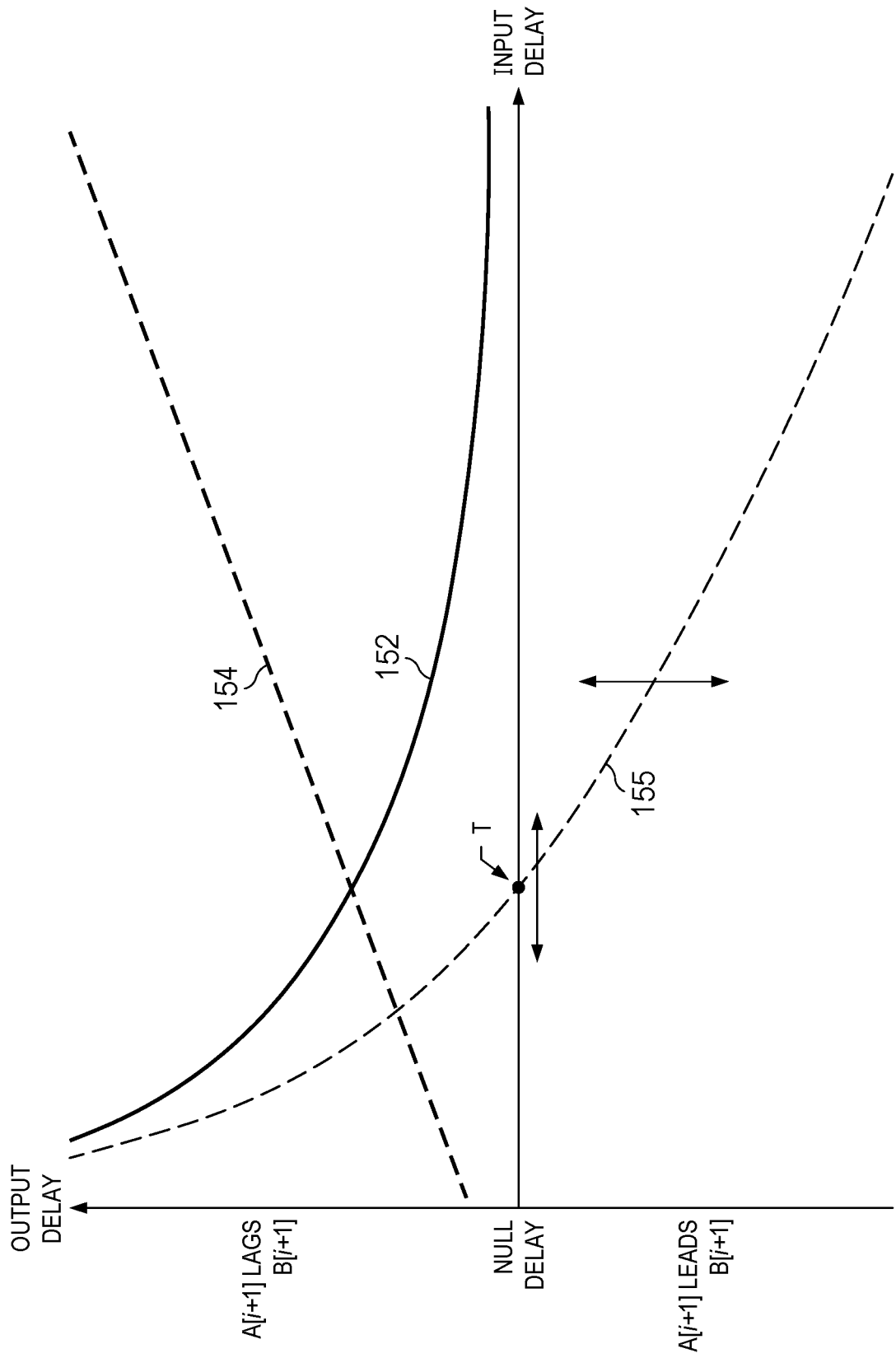
FIG. 1C illustrates plots of the transfer functions of the delay comparator of FIG. 1A, the AND logic function of FIG. 1B, and of a residue stage including those circuits.

FIG. 1C illustrates the transfer function of the output delay of a delay comparator such as delay comparator 110 in response to the input delay to the residue stage containing that delay comparator. The response of a delay comparator 110 to the relative delay between transitions at input residue signal lines A[i−1], B[i−1] generally follows an inverse logarithmic function, as shown by curve 152 in FIG. 1C. As such, a shorter input delay at delay comparator 110 results in a longer output delay in the transition at residue signal line A[i], and vice versa. Accordingly, the timing of a transition at residue signal line A[i] from delay comparator 110 in response to the residue value communicated by input residue signal lines A[i−1], B[i−1] can be calibrated by adjustment of the capacitance of variable trim capacitor 120.

FIG. 1C also illustrates the transfer function of the output delay of a logic function such as logic function 130 in response to the input delay to that residue stage. Curve 154 illustrates the delay of the transition at output residue signal line B[i] as generated by logic function 130 in response to the later of the input transitions at residue signal lines A[i−1], B[i−1], generally according to a linear function. As such, a shorter input delay to logic function 130 results in a shorter output delay in the transition at residue signal line B[i], and vice versa.

As noted above, the residue generated at the output of a given residue stage is expressed by the delay time between rising edge transitions at its output residue signal lines A[i], B[i] in response to the input delay received by that residue stage. Curve 155 of FIG. 1C corresponds to the difference between curves 152 and 154, which expresses the transfer function of output delay in response to input delay for this conventional residue stage. The output delay at residue signal lines A[i], B[i] from this residue stage serves as the input delay to the next residue stage in the pipeline. Negative output delay values are indicated by the transition at residue signal line A[i] leading that at residue signal line B[i], and positive output delay values are indicated by the transition at residue signal line A[i] lagging that at residue signal line B[i]. As evident from curve 155, the transfer function of input delay to output delay at a given residue stage is non-linear. Calibration of the ADC may thus be necessary to attain the desired accuracy.

As described in the above-incorporated U.S. Pat. No. 11,316,526, calibration may be performed by applying a known input voltage to the ADC, and then adjusting delay in one or more bit stages of the TDC stage to obtain a correct digital output for that known input voltage. For the case of conventional delay comparator 110 and logic function 130 of FIGS. 1A and 1B, this adjusting of the delay in calibration is performed by changing the capacitances of variable trim capacitors 120 and 140, as noted above. Referring to FIG. 1C, changing the capacitance of variable trim capacitor 120 adjusts the response of conventional delay comparator 110 in its generating of a transition at residue signal line A[i], effectively shifting curve 152 in FIG. 1C. Similarly, changing the capacitance of variable trim capacitor 140 adjusts the response of logic function 130 in its generating of a transition at residue signal line B[i], effectively shifting curve 154 in FIG. 1C.

Adjusting either or both of delay comparator 110 and logic function 130 thus has the effect of shifting the output delay transfer characteristic (curve 155) upward or downward. Shifting curve 155 accordingly shifts the input delay value at which the output delay transfer characteristic crosses the null delay threshold T along that curve. Null delay threshold T corresponds to the input delay at residue signal lines A[i−1], B[i−1] at which the residue stage would generate coincident transitions (zero delay) at its output residue signal lines A[i], B[i]. Accordingly, null delay threshold T at one residue stage determines the sign bit to be output by the next residue stage in the TDC sequence.

It is within this context that the embodiments described herein arise. The following examples are described as implemented into a pipelined delay-domain ADC. It is further contemplated that these examples may be beneficially applied in other applications, for example data converters or other delay-domain processing circuits in which calibration compensation of non-linearities may be beneficial. Accordingly, the following description is provided by way of example only.

Figure 2A:
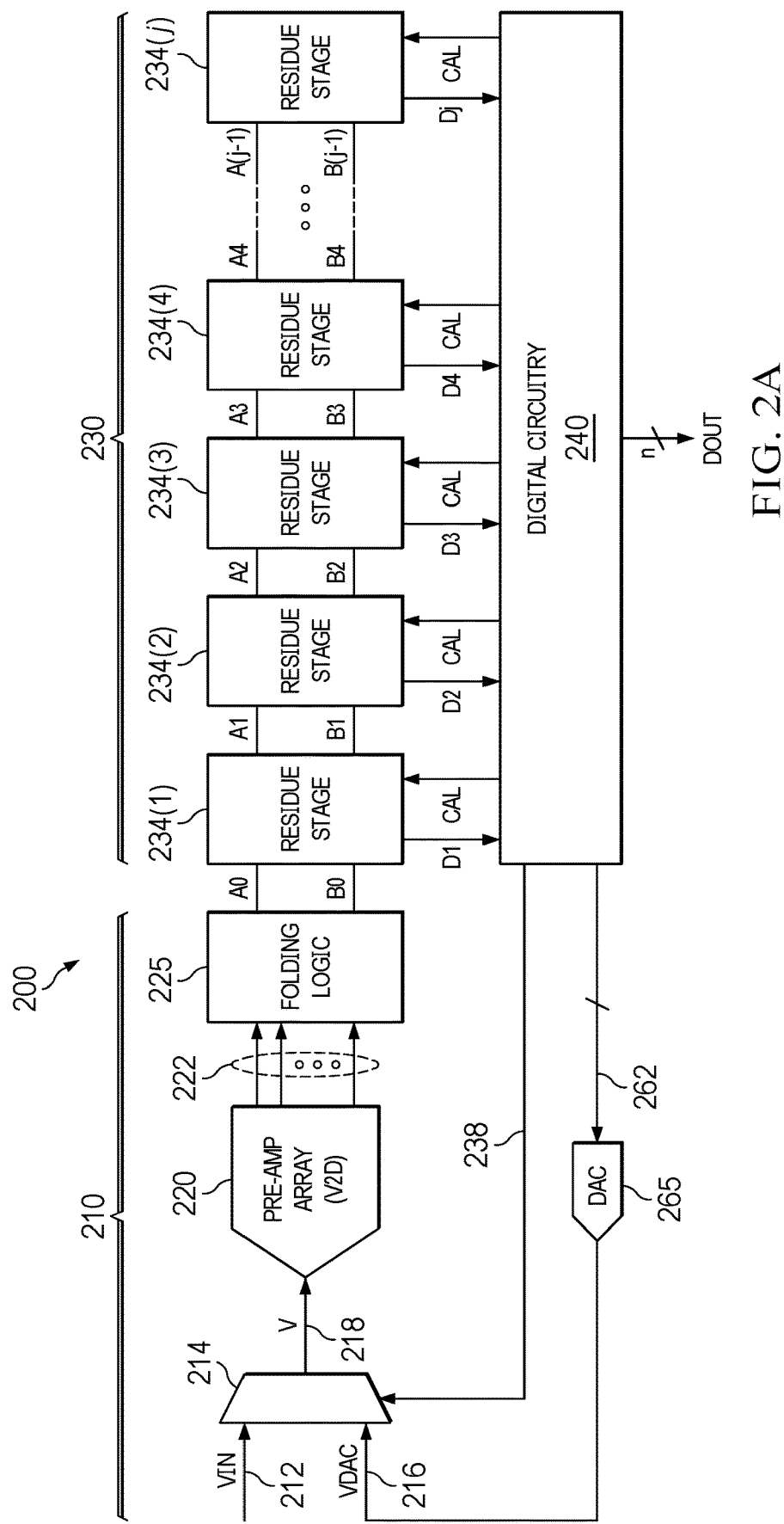
FIG. 2A is an electrical diagram, in block form, of an analog-to-digital converter.

FIG. 2A illustrates an example delay domain ADC 200. ADC 200 includes a voltage-to-delay (V2D) component 210, a time-to-digital converter (TDC) component 230, and digital circuitry 240. V2D component 210 may alternatively be referred to as the "front end" of ADC 200. TDC component 230 (in some cases along with digital circuitry 240) may alternatively be referred to as the "back end" of ADC 200.

In the example of FIG. 2A, V2D component 210 includes multiplexer 214, a pre-amplifier array 220, and folding logic 225. As shown, V2D component 210 of ADC 200 has a first input line 212 on which an input voltage VIN may be applied to a first input of a multiplexer 214, and a second input line 216 on which a calibration voltage VDAC may be applied to a second input of multiplexer 214. Multiplexer 214 has an output line 218 coupled to an input of pre-amplifier array 220, on which an analog voltage V corresponding to either the first voltage VIN or the calibration voltage VDAC is communicated to pre-amplifier array 220. Multiplexer 214 also has a control input receiving select line 238 from digital circuitry 240.

In ADC 200, input voltage VIN corresponds to an analog voltage that is to be converted to a digital word DOUT. Input voltage VIN may correspond to a sample of a time-varying signal, for example as obtained by a sample-and-hold circuit (not shown). Calibration voltage VDAC is produced by digital-to-analog converter (DAC) 265, which has an input coupled to signal line 262 to receive a digital calibration voltage word from digital circuitry 240. As described below, digital circuitry 240 can periodically or otherwise place ADC 200 into a calibration operation. For example, calibration is carried out by digital circuitry 240 applying a calibration voltage word to DAC 265. In turn, DAC 265 applies a corresponding analog voltage VDAC to multiplexer 214. In response to a control signal from digital circuitry 240 on line 238, multiplexer 214 selects calibration voltage VDAC for forwarding as voltage V to pre-amplifier array 220.

Pre-amplifier array 220 operates as a voltage-to-delay device. In some examples, such as described in the above-incorporated U.S. Pat. No. 10,673,456, pre-amplifier array 220 may have multiple pre-amplifiers that compare the analog voltage V from multiplexer 214 with different threshold voltages. In those examples, each pre-amplifier generates at least one delay signal representing the result of the comparison with the corresponding threshold voltage. As shown in FIG. 2A, pre-amplifier array 220 has multiple outputs coupled to corresponding signal lines 222, which output the delay signals from corresponding pre-amplifiers to folding logic 225. For example, each pre-amplifier in pre-amplifier array 220 has two outputs (one output being the complement of the other), such that each of signal lines 222 corresponds to two complementary signal lines.

Copending and commonly assigned U.S. patent application Ser. No. 17/898,844, filed 30 Aug. 2022 and entitled "Multi-Bit Voltage-to-Delay Conversion in Data Converter Circuitry," said application incorporated herein by reference in its entirety, describes an alternative construction of V2D component 210 with which the example embodiments may be implemented. In this example, V2D component 210 includes a multi-bit input buffer that generates output signals that are applied to a V2D comparator stage to produce delay signals at multiple outputs. The delay signals are forwarded via signal lines 222 to folding logic 225.

Folding logic 225 in V2D component 210 in the arrangement of FIG. 2A includes digital logic gates arranged to generate logic transitions at lines A0, B0 that have a relative delay corresponding to the amplitude difference between analog voltage V on line 218 and the nearest threshold voltage at pre-amplifier array 220. The above-incorporated U.S. Pat. No. 10,673,456 and U.S. patent application Ser. No. 17/898,844 describe examples of the construction of folding logic 225 as suitable for use in connection with example embodiments. Delay signal lines A0, B0 at outputs of folding logic 225 are coupled to inputs of time-to-digital converter (TDC) component 230. TDC component 230 operates together with digital circuitry 240 to encode n bits of digital output word DOUT in response to the relative time delay between the logic transitions at lines A0, B0.

In the example of FIG. 2A, TDC component 230 of ADC 100 includes j residue stages 234 coupled in a sequence. First residue stage 234(1) has inputs coupled to lines A0, B0 from V2D component 210, and outputs coupled to residue signal lines A1, B1. Second residue stage 234(2) in the sequence has its inputs coupled to lines A1, B1 from first residue stage 234(1), third residue stage 234(3) has its inputs coupled to residue signal lines A2, B2 from the outputs of previous residue stage 234(2), inputs of fourth residue stage 234(4) in the sequence are coupled to residue signal lines A3, B3 at the outputs of previous residue stage 234(3), and so on. According to this example, residue stages 234 operate in j successive stages (j≥1). Each residue stage 234 processes a delay residue from the previous stage to provide a respective bit of digital information on a corresponding digital signal line D1, D2, . . . , Dj to digital circuitry 240. Each residue stage 234 may also have one or more inputs receiving a calibration signal from digital circuitry 240 on one or more signal lines CAL.

Alternatively, the first residue stage of TDC component 230 may be a multi-bit stage, an example of which is described in the above-incorporated U.S. Pat. No. 11,316,526. In that case, the multi-bit residue stage can generate k bits (k≥1) of digital information that are forwarded to digital circuitry 240 on corresponding signal lines.

Figure 2B:
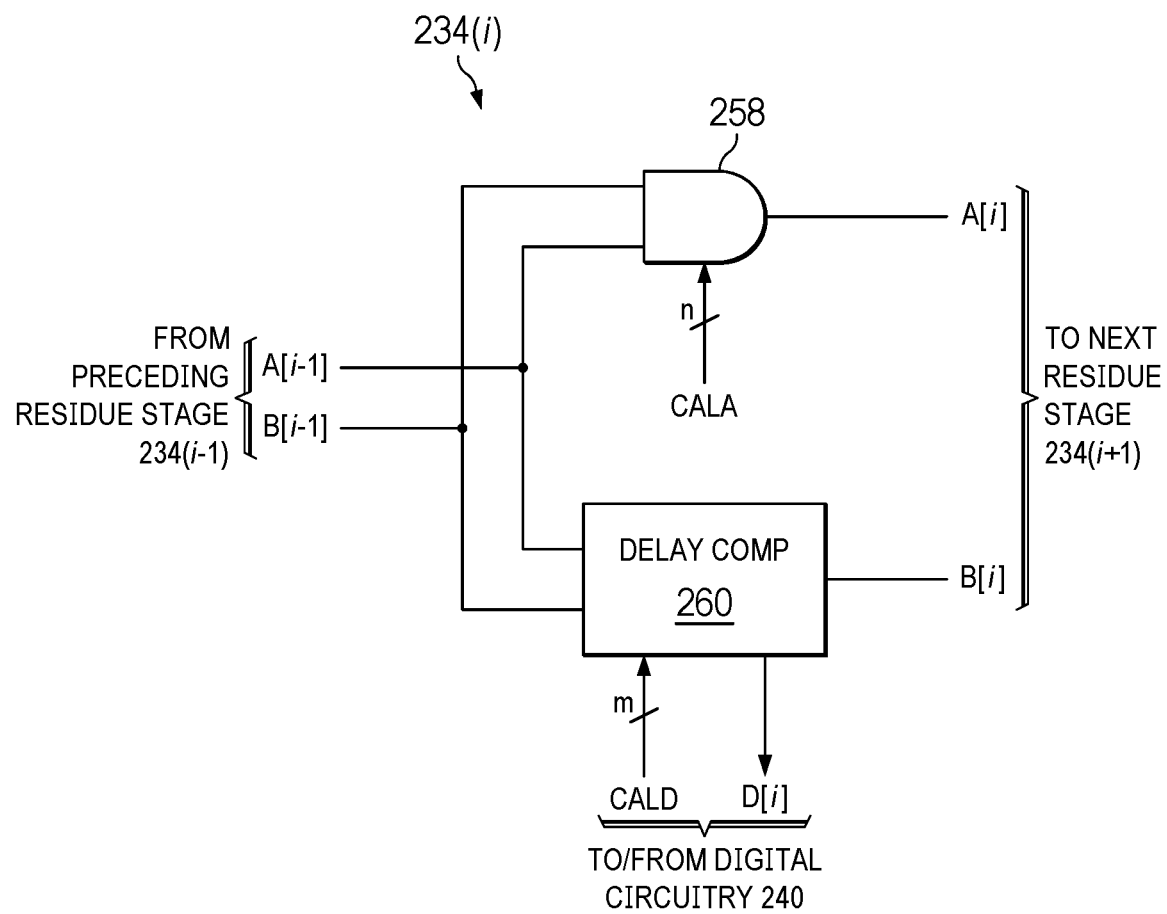
FIG. 2B is an electrical diagram, in block form, of a residue stage in the analog-to-digital converter of FIG. 2A.

FIG. 2B illustrates an example residue stage 234(i), for instance as implemented in the ADC of FIG. 2A. In this example, each of residue stages 234 is constructed similarly as one another in a general sense. Within the ADC, differences in the internal calibration circuitry may be present among residue stages 234, as described below.

In the example of FIG. 2B, $i^{th}$ residue stage 234(i) includes logic gate 258 and delay comparator 260. Logic gate 258 is shown in the form of an AND function, but may alternatively be implemented by a different logic function (e.g., NOR, NAND, OR) as appropriate for the architecture. Logic gate 258 in the example of FIG. 2B has two inputs, one input coupled to line A[i−1] from the previous residue stage 234(i−1) in the sequence, and the other input coupled to line B[i−1] from that same previous residue stage 234(i−1). An output of logic gate 258 is coupled to line A[i], which is coupled to an input of the next residue stage 234(i+1) in the sequence. In this example in which logic gate 258 is represented by an AND function, and similarly as described in the above-incorporated U.S. Pat. No. 10,778,243, logic gate 258 outputs a logic transition onto line A[i] in response to the later-arriving of the residue signals on lines A[i−1] and B[i−1]. As described in further detail below, logic gate 258 has an input coupled to calibration signal line(s) CALA to receive a calibration signal from digital circuitry 240.

Delay comparator 260 also has inputs coupled to line A[i−1] and line B[i−1] from the previous residue stage 234(i−1) in the sequence. Delay comparator 260 for this $i^{th}$ residue stage in the sequence has a digital output coupled to line D[i], via which the $i^{th}$ bit is communicated from residue stage 234 to digital circuitry 240. Delay comparator 260 also has a residue output coupled to line B[i], which is coupled to an input of the next residue stage 234(i+1) in the sequence. Delay comparator 260 outputs a logic transition onto line B[i] in response to the first-arriving of the residue signals on lines A[i−1] and B[i−1]. As will be described in further detail below, delay comparator 260 has an input coupled to calibration signal line(s) CALD to receive a calibration signal from digital circuitry 240.

In an example, the residue signals on lines A[i−1], B[i−1] are in the form of logic level transitions (e.g., rising edge transitions from a low logic level to a high logic level), with the residue value expressed by a relative time delay between the transitions on the two lines A[i−1], B[i−1]. The residue value may have either a negative or positive polarity, indicated by the transition on line A[i−1] leading or lagging the transition on residue signal line B[i−1]. Each residue stage 234 in ADC 200 in turn generates signal transitions on its output lines A[i], B[i], from logic function 258 and delay comparator 260, respectively, with the relative time delay in those transitions expressing a residue value from that $i^{th}$ instance of residue stage 234(i).

As noted above, one source of error in delay-domain ADCs is non-linearity in the time-to-digital conversion operation. In particular, the operation of delay comparators in delay-domain ADCs is non-linear, with the output transition occurring as a non-linear function of the residue delay at its inputs. Calibration of the residue stages in the "back end" of delay domain ADCs compensates for this non-linearity as well as other error in the conversion.

The accuracy of the calibration of delay comparators, such as conventional delay comparator 110 described above relative to FIG. 1A, is somewhat limited, however. For example and referring to FIGS. 3A and 3B, limitations in the calibration approach applied to delay comparator 110 and logic function 130 of FIGS. 1A and 1B are described below.

Figure 3A:
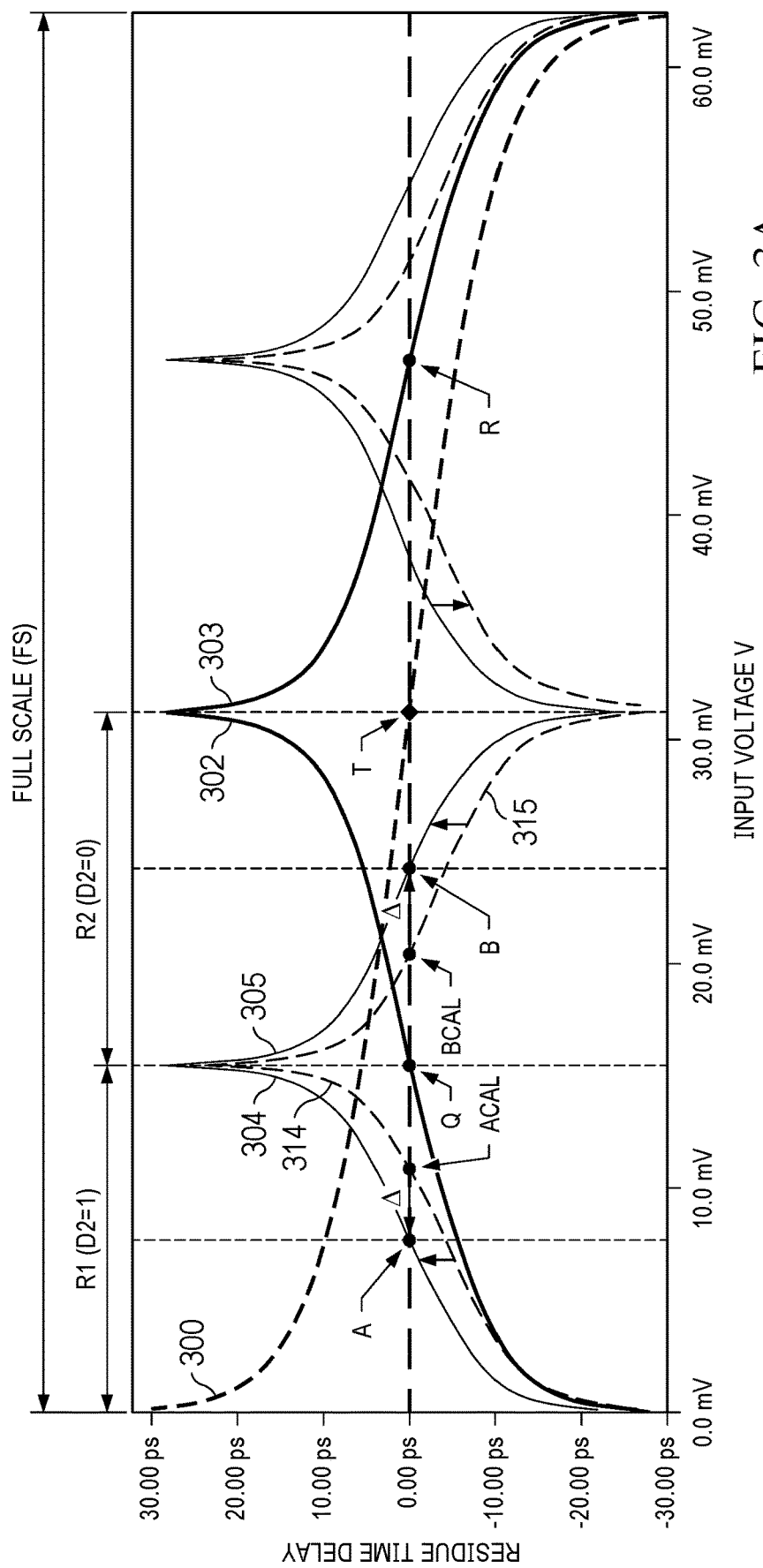
FIG. 3A illustrates curves of residue delay versus input voltage at residue stages of an analog-to-digital converter including the delay comparator of FIG. 1A and the AND logic function of FIG. 1B.

FIG. 3A illustrates a series of plots of residue time delay at each of a sequence of residue stages in the TDC stage of a delay-domain ADC (e.g., each containing delay comparator 110 and logic function 130), over the (positive) full scale range of input analog voltage V. In this example, the full scale of the ADC is +62 mV. Curve 300 illustrates the residue delay at the input of a first residue stage in the pipeline, as generated for example from the V2D stage, over input voltage V ranging over the full scale from 0.0 mV to +62 mV. A null delay threshold T (e.g., the crossing point of curve 300 at the residue time delay of 0.00 psec) for input voltage V is present at about ½ of this full scale (½ FS). In this example, an input voltage V greater than ½ FS is represented by a negative time delay, and an input voltage less than ½ FS is represented by a positive time delay. Null delay threshold T is thus the threshold applied by this first residue stage in deriving the value of a sign bit at that residue stage.

This first residue stage produces a residue delay that is applied to a second residue stage in the pipeline, at a relationship to input voltage V illustrated by curves 302 and 303 of FIG. 3A. As evident from FIG. 3A, curve 302 is an inverse logarithmic curve for voltage V less than ½ of full scale (e.g., <31 mV) and curve 303 is a mirror image of curve 302 for voltage V greater than ½ of full scale (e.g., >31 mV). The sign bit determined by the first residue stage determines which of the two curves 302, 303 applies to the output residue from second residue stage. Curves 302 and 303 have null delay thresholds Q and R, respectively, that are to be used by the next, third, residue stage in generating the value of its sign bit.

Similarly, the third residue stage in the pipeline receives a residue delay according to one of curves 302, 303 (as indicated by the polarity of the delay), and in turn generates a sign bit, and an output residue for evaluation by the next, fourth, residue stage. Curves 304, 305 illustrate the relationship between the output residue delay from this third residue stage for the case in which the input voltage V is less than ½ FS. Similar curves apply for input voltages greater than ½ FS, as shown. Curve 304 is an inverse logarithmic curve for input voltage V below null delay threshold Q at about 1% of full scale, indicated as range R1 in FIG. 3A, while curve 305 applies to input voltage V between null delay threshold Q and null delay threshold T from the previous residue stage, indicated in FIG. 3A as range R2. The sign bit from the previous residue stage determines which of the two curves 304, 305 is applies to this residue, and thus indicates (to digital circuitry) the one of ranges R1, R2 within which the input voltage V lies.

As described above, calibration of the delay transfer characteristic at a given residue stage in a pipelined TDC architecture adjusts the null delay thresholds that will be applied by the next residue stage in the pipeline. However, only a single degree of freedom is provided in the calibration of the residue stages constructed according to FIGS. 1A and 1B described above. Accordingly, conventional calibration of either or both of conventional delay comparator 110 and logic function 130 moves all null delay thresholds defined by that residue stage as illustrated in FIG. 3A.

In FIG. 3A, consider residue curve 314 as the behavior of delay comparator 110 prior to calibration, exhibiting a null delay threshold ACAL. Calibration of the ADC may be performed by applying a known calibration voltage VDAC, for example at a voltage of about ⅛ FS (within range R1), and adjusting variable trim capacitor 120 in delay comparator 110 and variable trim capacitor 140 in logic function 130 to null the output residue time delay (e.g., to 0.00 psec) at that input voltage. This calibration effectively shifts the residue curve up or down in the illustration of FIG. 3A, for example to the position of curve 304. (The amount of this shift from curve 314 to curve 304 is exaggerated in FIG. 3A for purposes of illustration.) As evident in FIG. 3A, this calibration to the position of curve 304 has shifted the null delay threshold from its previous point ACAL by an amount Δ to point A, which corresponds to the applied calibration voltage VDAC (e.g., at about ⅛ FS).

However, the adjustment of variable trim capacitor 120 in delay comparator 110 changes the response of voltage barrier 114 for both positive and negative input residue delay values at lines A[i−1], B[i−1]. Accordingly, the calibration of delay comparator 110 that shifts residue curve 314 to curve 304 based on a calibration voltage in range R1 of about ⅛ FS also shifts the response of delay comparator 110 for voltages in range R2. As shown in FIG. 3A, the calibration shift from curve 314 to curve 304 at the same time also shifts curve 315 for range R2 to curve 305. Null delay threshold BCAL of curve 305 thus shifts by an amount Δ to a point B as a result of the calibration at an input voltage in range R1 (e.g., at or near ⅛ FS). In addition, the same calibration shift also applies to input voltages greater than ½ FS, such that all four null delay thresholds defined by this residue stage receives the same calibration adjustment. While null delay threshold point A may correctly correspond to the applied known calibration voltage within range R1, calibration for range R1 may significantly miscalibrate the residue stage for voltages in range R2 and at other values. For example, the shifted null delay threshold B in range R2 may not correspond to the input voltage at ⅜ FS.

Figure 3B:
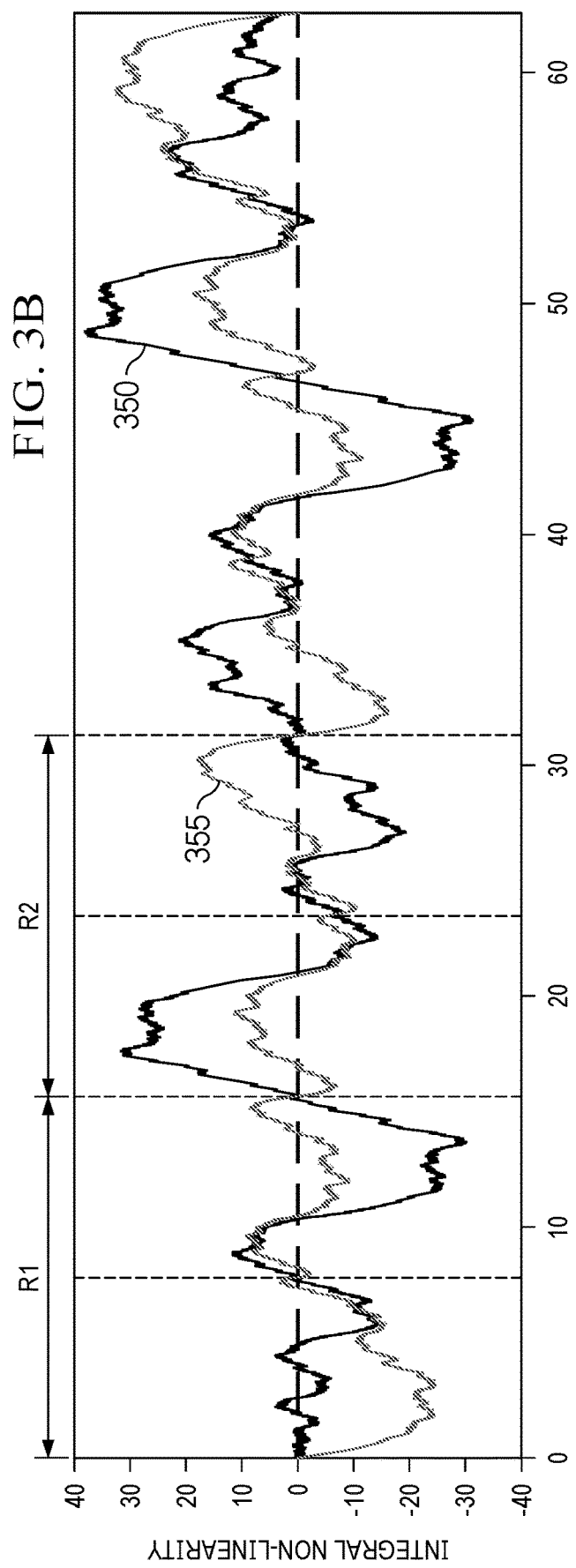
FIG. 3B illustrates plots of integral non-linearity versus input voltage for an analog-to-digital converter including the delay comparator of FIG. 1A and the AND logic function of FIG. 1B according to some calibration approaches.

This miscalibration effect has been observed to affect the error performance of the ADC over the full scale range. FIG. 3B illustrates the error results of calibration of a residue stage as described above, for the example of FIG. 3A. For example, plot 350 illustrates the integral non-linearity over full scale for calibration of residue stage R1 (e.g., at or near ⅛ FS) for an example ADC constructed as described above relative to FIGS. 1A and 1B. In FIG. 3B, integral non-linearity plot 350 is expressed as the difference in digital code value (at the 12 bit level) between the input voltage and the digital code output by the ADC. As evident from plot 350, relatively low error is attained over that same range R1 (as well as within a corresponding input voltage range above ¾ FS), but the error from this calibration is quite high in range R2 between ¼ FS and ½ FS. Similarly, according to this approach, if the calibration were instead performed at a known input voltage within range R2 (e.g., at or near ⅜ FS), low error performance would be obtained over range R2 but the error performance over range R1 would be poor. Similar effects (at errors of opposite polarity) appear for voltages above ½ FS.

Another calibration approach is performed by ramping the DAC calibration voltage while adjusting the delay of the residue stage being calibrated to minimize the difference between the total number of "1" sign bits and the total number of "0" sign bits output by the following residue stage. Plot 355 of FIG. 3B illustrates the integral non-linearity of this calibration approach as applied to the same ADC. Plot 355 indicates that this approach may exhibit improvement on an average basis over the approach shown by plot 350, but provides poorer performance at the cross-over points of ⅛ FS and ⅜ FS.

Figure 4A:
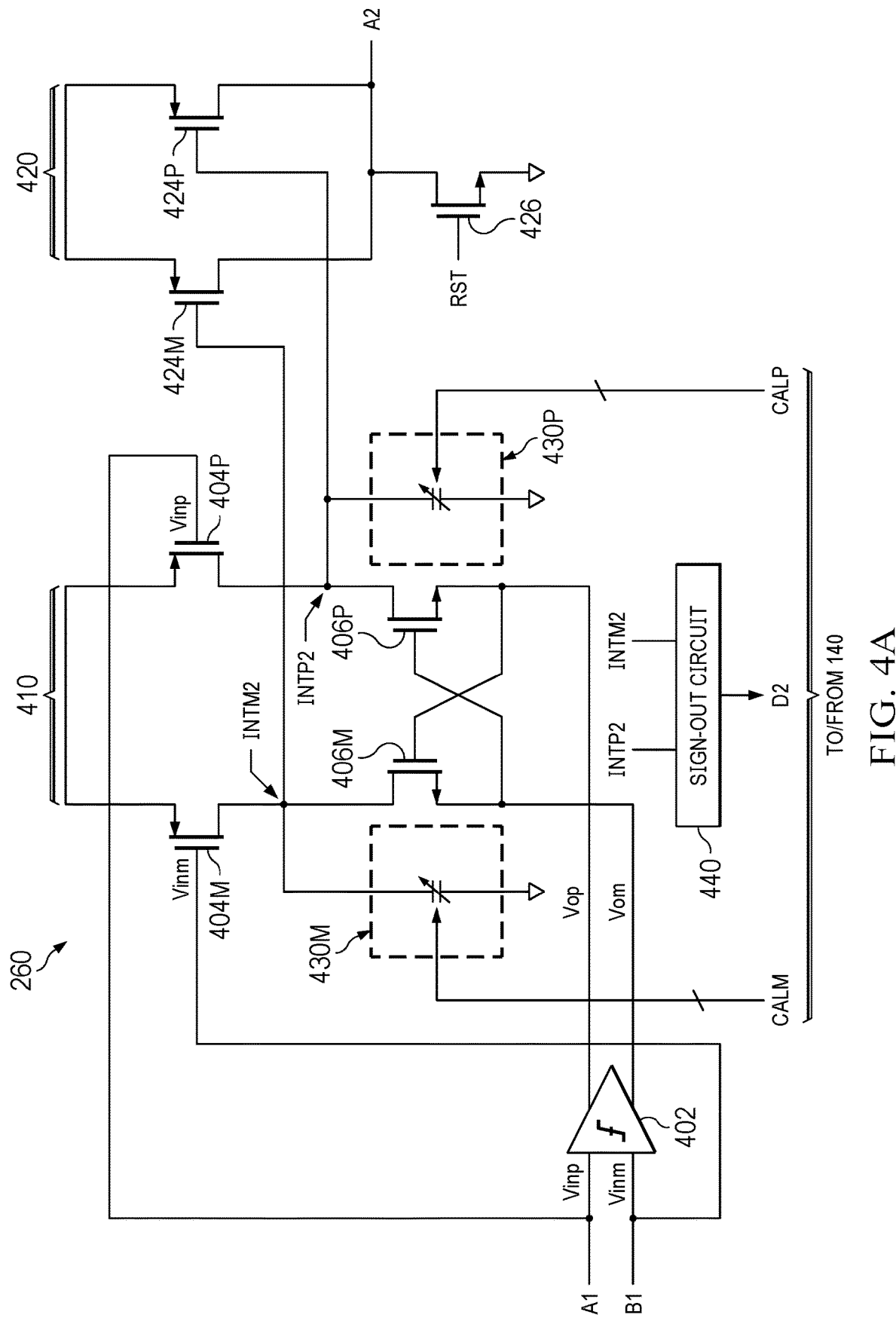
FIG. 4A is an electrical diagram, in schematic form, of an example delay comparator in the residue stage of FIG. 2B.
Figure 4B:
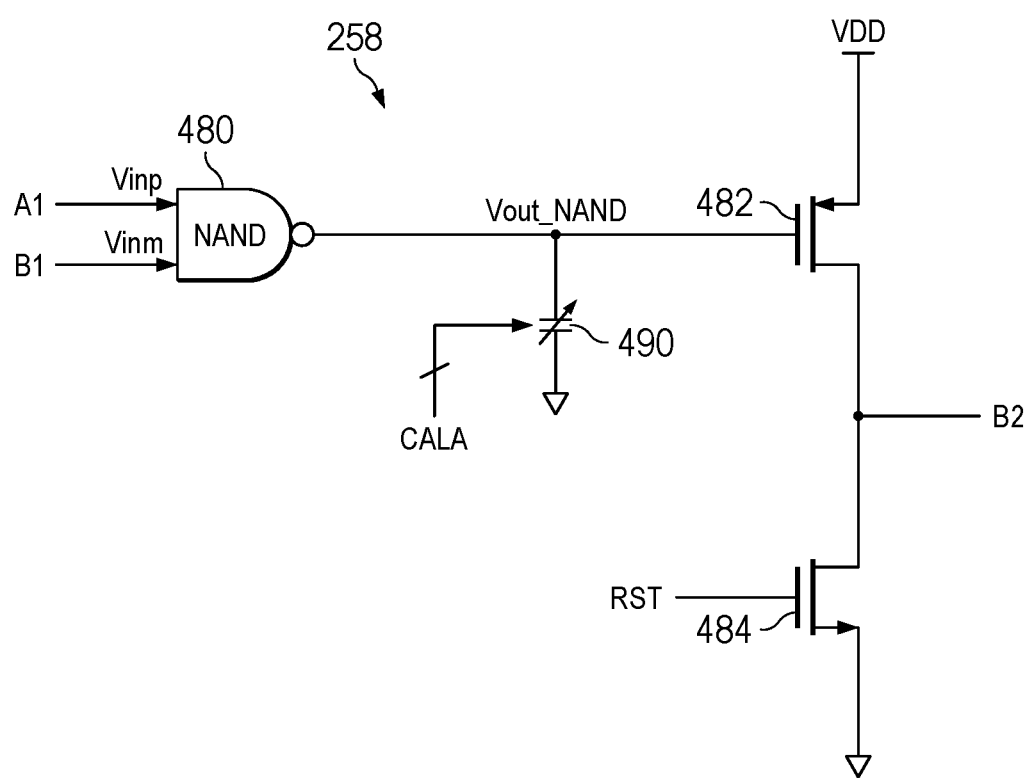
FIG. 4B is an electrical diagram, in schematic form, of an example logic function in the residue stage of FIG. 2B.

At least some of the remaining examples described below address the above limitations in calibrating delay-domain ADCs. For instance, FIG. 4A illustrates an example delay comparator 260 and FIG. 4B illustrates an example logic function 258, as implemented in residue stage 234 of TDC component 230 of ADC 200 (FIG. 2A). Implementing delay comparator 260 and logic function 258 into residue stages may address some of the above-described limitations in calibrating delay-domain ADCs.

For example, delay comparator 260 and logic function 258 are incorporated into one or more residue stages 234 of ADC 200, and in some examples are incorporated into each and every residue stage of the ADC. In some other examples, not all residue stages 234 include calibration functionality for either or both of its delay comparator and logic function. For instance, first residue stage 234(1) in TDC component 130 may not include the calibration functionality of FIG. 4A for its delay comparator, but may include calibration functionality (e.g., as shown in FIG. 4B) for its logic function only.

While delay comparator 260 of FIG. 4A may be implemented in one, some, or all of residue stages 234 of TDC component 230, the instance of delay comparator 260 of FIG. 4A will be described for the case of second residue stage 234(2) in the sequence of residue stages 134. Delay comparator 260 of FIG. 4A includes a time-domain comparator 402, a voltage barrier circuit 410, an output stage 420, trim circuit 430M, trim circuit 430P, and sign-out circuit 440.

Time-domain comparator 402 has first and second inputs Vinp, Vinm coupled to lines A1, B1, respectively, to receive a delay residue from first residue stage 234(1). Time-domain comparator 402 is constructed and operates to issue a differential voltage at its outputs Vop, Vom in response to the delay between logic level transitions at its inputs Vinp, Vinm. For example, in response to a rising edge at input Vinm leading a rising edge at input Vinp, time-domain comparator 402 drives its output Vom toward circuit ground and maintains its output Vop at or near the VDD power supply voltage. Conversely for the example of a rising edge at input Vinp leading a rising edge at input Vinm, time-domain comparator 402 drives its output Vop toward circuit ground and maintains its output Vom at or near the VDD power supply voltage. In either case, the amplitude of the differential voltage at outputs Vop, Vom corresponds to the delay between the input transitions.

Outputs Vop, Vom of time-domain comparator 402 are coupled to voltage barrier circuit 410 in delay comparator 260. More particularly, voltage barrier circuit 410 includes two transistor legs coupled to the outputs of time-domain comparator 402. One leg of voltage barrier circuit 410 includes PMOS reset transistor 404M and NMOS transistor 406M. PMOS reset transistor 404M has a source coupled to a VDD power supply, a gate coupled to the Vinm input, and a drain coupled to the drain of NMOS transistor 406M at intermediate node INTM2. NMOS transistor 406M has a source coupled to the Vom output of time-domain comparator 402, and a gate coupled to the Vop output of time-domain comparator 402. The second leg includes PMOS reset transistor 404P and NMOS transistor 406P. PMOS reset transistor 404P has a source coupled to the VDD power supply, a gate coupled to the Vinp input, and a drain coupled to the drain of NMOS transistor 406P at intermediate node INTP2. NMOS transistor 406P has a source coupled to the Vop output of time-domain comparator 402, and a gate coupled to the Vom output of time-domain comparator 402.

Intermediate nodes INTP2, INTM2 serve as the outputs of voltage barrier circuit 410, and are coupled to output stage 420. More particularly, output stage 420 includes PMOS transistor 424P, PMOS transistor 424M, and NMOS reset transistor 426. As shown, intermediate node INTP2 is coupled to the gate of PMOS transistor 424P, which has its source coupled to the VDD power supply and its drain coupled to residue signal line A2. Similarly, intermediate node INTM2 is coupled to the gate of PMOS transistor 424M, which has its source coupled to the VDD power supply and its drain coupled to residue signal line A2. NMOS reset transistor 426 has a drain coupled to the drains of PMOS transistors 424P, 424M at residue signal line A2, a source coupled to circuit ground, and a gate receiving a reset signal RST (e.g., from digital circuitry 240).

Delay comparator 260 provides the sign output (D2 in this example) to digital circuitry 240. More particularly, sign-out circuit 440 has inputs coupled to intermediate nodes INTP2, INTM2 of voltage barrier 410, and generates sign output D2 based on the polarity of the input residue delay. Sign-out circuit 440 may be constructed as a clocked latch, or flip-flop, comparator, or other circuit that generates a digital output in response to the polarity at a pair of inputs. An example of sign-out circuit 440 as part of a delay comparator is described in the above-incorporated U.S. Pat. No. 11,316, 526. Other configurations of sign bit logic may be incorporated into delay comparator 260 to derive sign bit D2. In another example, intermediate nodes INTP2, INTM2 are directly coupled to digital circuitry 240 for its determination of sign bit D2.

In operation, residue signal lines A1, B1 are both at a low logic level between sample conversions, which turns on both of PMOS reset transistors 404P, 404M and pulls both intermediate nodes INTP2, INTM2 to a high logic level. Outputs Vop, Vom from time-domain comparator 402 are low at this time. NMOS reset transistor 426 in output stage 420 is also turned on by reset signal RST between sample conversions. This pulls output residue signal line A2 to a low logic level, since PMOS transistors 424P, 424M are both off due to the high logic level at intermediate nodes INTP2, INTM2.

In response to the first of the logic level transitions at input residue signal lines A1, B1, time-domain comparator 402 begins driving a differential voltage at its outputs Vop, Vom. For example, a rising edge transition at line A1 leading a transition at line B1 causes time-domain comparator 402 to drive a differential voltage at its outputs, with the voltage at output Vop lower than that at output Vom. The magnitude of this differential voltage corresponds to the delay between the transitions at residue signal lines A1, B1. In addition, the high logic level at input Vinp after this transition turns off PMOS reset transistor 404P. The higher voltage at output Vom relative to the voltage at output Vop, if greater than the threshold voltage of NMOS transistor 406P, turns on that transistor, which pulls intermediate node INTP2 toward the lower voltage of output Vop. The drive applied to NMOS transistor 406P depends on the magnitude of the differential voltage at the outputs of time-domain comparator 402, and thus the delay between the transitions at lines A1, B1. As intermediate node INTP2 is driven low, PMOS transistor 424P in output stage 420 turns on and drives a rising edge transition at output line A2.

Conversely, in response to a logic level transition at input line B1 leading that at 1 line A1, time-domain comparator 402 drives a differential voltage with output Vom at a lower voltage than output Vop, at a differential magnitude inversely related to the delay between the transitions at lines A1, B1. NMOS transistor 406M turns on responsive to this differential voltage exceeding its threshold voltage, pulling intermediate node INTM2 toward the voltage at output Vom. This lower level at intermediate node INTM2 turns on PMOS transistor 424M in output stage 420, driving a low-to-high transition at output residue signal line A2.

According to this example, the response of delay comparator 260 in its driving of a transition at output line A2 relative to the delay between the transitions at input lines A1, B1 may be calibrated for the case of the transition at input line A1 leading that at input line B1 (sign bit D2=1) separately and independently from calibrating for the case of the transition at line A1 lagging that at line B1 (sign bit D2=0). Namely, separate trim circuits 430M and 430P are used to implement this separate calibration.

As shown in FIG. 4A, trim circuit 430P is coupled between intermediate node INTP2 and circuit ground, and trim circuit 430M is coupled between intermediate node INTM2 and circuit ground. In one example, each of trim circuits 430P, 430M are constructed as a variable capacitor. For instance, trim circuits 430P, 430M are constructed as switched capacitor arrays in which individual capacitors may be switched into or out of the circuit in response to digital calibration words communicated from digital circuitry 240 on signal lines CALP, CALM, respectively. In that example, the capacitors in the switched capacitor array may be binary-weighted, or have the same capacitances, or may be arranged according to some other capacitance relationship. In some examples, trim circuits 430P, 430M each further include decoding logic for converting the digital calibration words on signal lines CALP, CALM to appropriate control signals. In any case, the selected capacitance presented by trim circuits 430P, 430M to intermediate nodes INTP2, INTM2 affects the response of delay comparator 260 to the residue signal at its inputs. Namely, an increase in capacitance slows the response, and a reduction in capacitance speeds up the response.

More particularly, providing separate trim circuits 430P, 430M at intermediate nodes INTP2, INTM2 allows the response of delay comparator 260 to be calibrated for the case in which the transition at line A1 leads that at line B1 independently from calibrating for the case in which the transition at line A1 lags that at line B1. For example, referring to FIG. 3A, if residue curve 304 applies for the case in which the A1 transition lags the B1 transition, indicating that the input voltage V is within range R1 (and resulting in sign bit D2=1), calibration may be performed by the calibration value on signal lines CALP to trim circuit 430P. Conversely, the calibration value on signal lines CALM from digital circuitry 240 to trim circuit 430M can separately adjust for the case in which the transition at line A1 leads that at line B1, indicating that the input voltage V is within range R2 (sign bit D2=0). In each case, the calibration applied by trim circuits 430P, 430M adjusts the timing of the transition generated by delay comparator 260 at output residue signal line A2 for input voltage V levels in ranges R1, R2, respectively.

FIG. 4B illustrates an example construction and calibration of logic function 258, as incorporated into one or more of residue stages 234 of ADC 200. In this example, logic function 258 is described for the case in which it is incorporated with delay comparator 260 of FIG. 4A into second residue stage 234(2) in the sequence of TDC component 230 of ADC 200. However, logic function 258 may be implemented into any, some, or all of residue stages 234 in TDC component 230. Moreover, logic function 258 may be implemented into one or more of residue stages 234 having a delay comparator 260 constructed differently from that of FIG. 4A (e.g., not including trim circuits 430P, 430M).

In the example of FIG. 4B, logic function 258 represents an AND function and includes a NAND gate 480 coupled to transistors 482 and 484, and further includes a trim circuit 490. NAND gate 480 has inputs Vinp, Vinm coupled to input residue lines A1, B1, respectively. The output of NAND gate 480 at node Vout_NAND is coupled to the gate of PMOS transistor 482 in an output stage of logic function 258. PMOS transistor 482 has its source coupled to the VDD power supply and its drain connected to the drain of NMOS reset transistor 484, at output line B2. NMOS reset transistor 484 receives reset signal RST at its gate, and has its source coupled to circuit ground. Output line B2 is reset to ground between conversions (reset signal RST at a high level). Conversely, PMOS transistor 482 turns on in response to NAND gate 480 driving a high-to-low transition at NAND output node Vout_NAND. PMOS transistor 482 in its on state drives output line B2 to a high logic level. In this arrangement, NAND gate 480 drives a high-to-low transition at node Vout_NAND in response to both of input lines A1, B1 having made a low-to-high transition. The high-to-low transition at node Vout_NAND thus occurs at the time of the later of the transitions at lines A1, B1. The turning on of PMOS transistor 482 at that time drives a low-to-high transition at output line B2.

In this example, trim circuit 490 is coupled to the output of NAND gate 480 at node Vout_NAND. Trim circuit 490 includes a variable capacitor coupled between Vout_AND and circuit ground, and has inputs coupled to receive a calibration signal from digital circuitry 240 on signal lines CALA. Trim circuit 490 may include a switched capacitor array with switchable capacitors being binary-weighted, similarly-sized, or in some other relationship. Trim circuit 490 may further include decoding logic as appropriate for converting the digital calibration words on signal lines CALA to the desired selected capacitance. The capacitance of trim circuit 490 affects the response of logic function 258 to the input residue signal, with an increase in capacitance increasing the response time and a reduction in capacitance reducing the response time. Accordingly, the timing of transitions at output line B2 relative to the later of the transitions at input lines A1, B1 (in this example) can be calibrated under the control of digital circuitry 240.

In this example, logic function 258 includes only a single trim circuit 490, such that the timing of transitions at output line B2 is not independently calibrated for the different input voltage ranges (e.g., ranges R1 and R2 of FIGS. 3A and 3B). As such, the separate and independent calibration at intermediate nodes INTP2, INTM2 of delay comparator 260 may be sufficient to apply adjustments to account for differences in the relevant voltage ranges, allowing logic function 258 to include only a single trim circuit 490 as shown in this example.

Figure 5A:
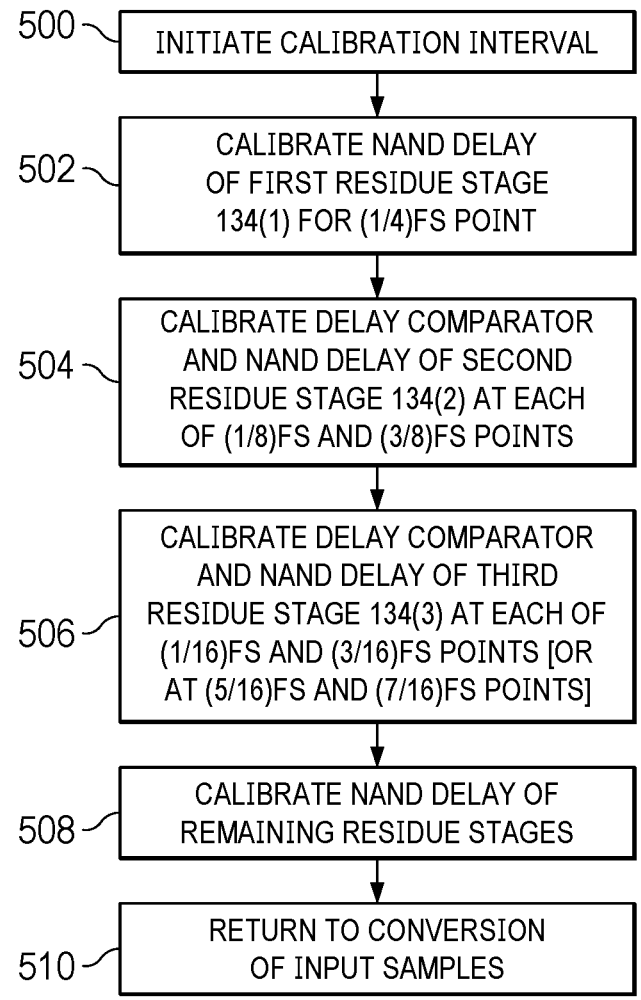
FIG. 5A is a flow diagram illustrating an example method of calibrating the analog-to-digital converter of FIG. 2A.

FIG. 5A illustrates an example method of calibrating ADC 200 of FIG. 2A, including process blocks 500-510. Calibration according to this example may be performed at any or all of power-up of ADC 200, periodically during its operation, and in response to events during operation (e.g., upon detection of an error condition, in response to an interrupt, etc.). In any event, calibration begins in process block 500 with the initiation by digital circuitry 240 of a calibration operation or interval. For example, digital circuitry 240 issues a control signal on signal line 238 to input multiplexer 214 to select calibration voltage VDAC on line 216 as the analog voltage V applied to ADC 200.

Figure 5B:
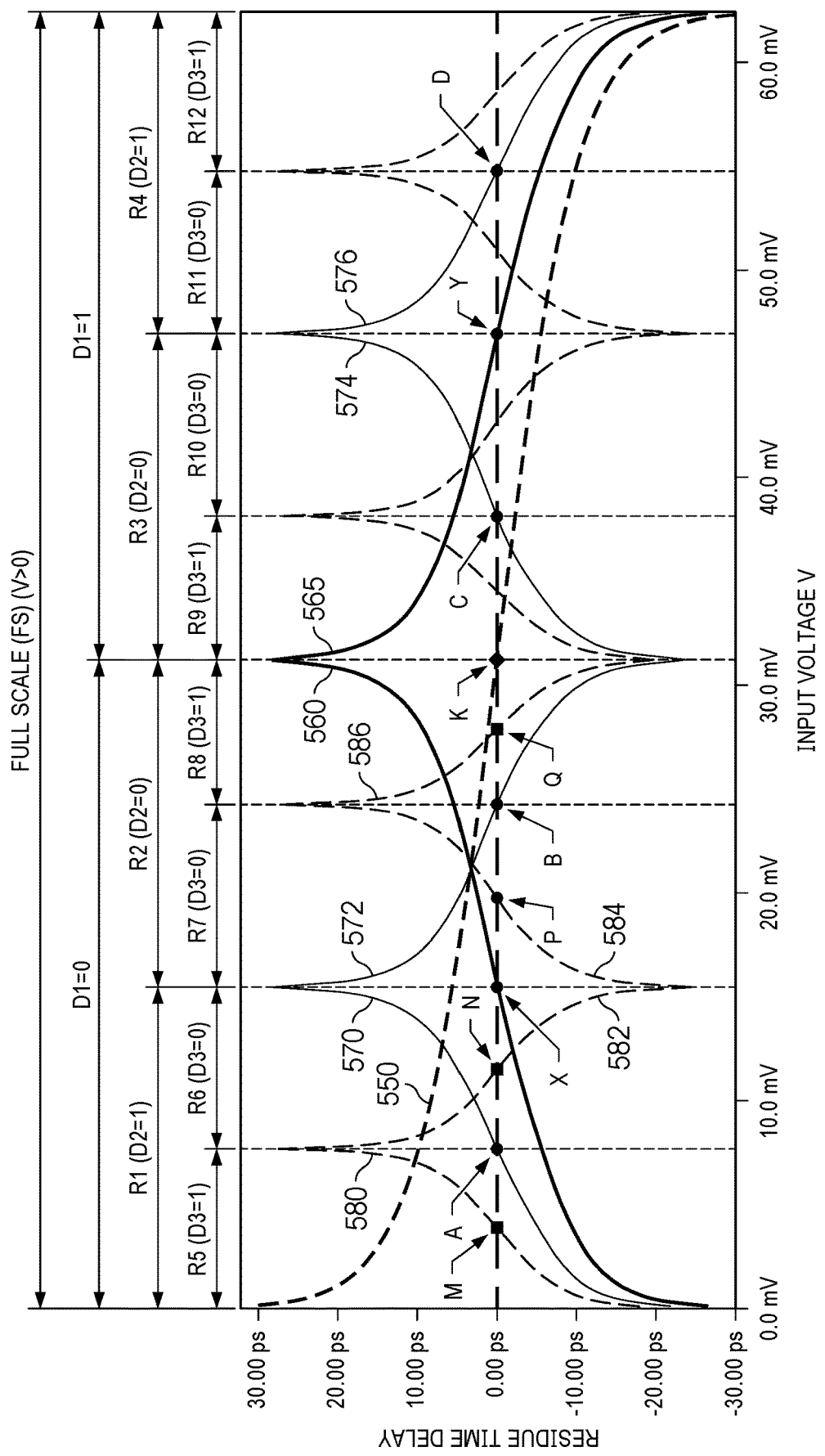
FIG. 5B illustrates example plots of residue delay versus input voltage illustrating calibration of the analog-to-digital converter of FIG. 2A.

FIG. 5B illustrates a series of example plots of input and output residue delay versus input voltage V at residue stages 234(1), 234(2), 234(3), and 234(4) in TDC component of delay-domain ADC 200, over the (positive) full scale range of input voltage V. In this example, the full scale of the ADC is +62 mV. Curve 550 of FIG. 5B illustrates the relationship of the input residue delay value applied on residue signal lines A0, B0 to first residue stage 234(1). As shown in FIG. 5B, null delay threshold K is present at about ½ FS.

In some examples, null delay threshold K at ½ FS for the residue at signal lines A0, B0 does not require calibration in the method of FIG. 5A, due to the symmetric construction of V2D component 210 of ADC 200. Accordingly, process block 502 in the method of FIG. 5A operates to calibrate residue stage 234(1). Referring to FIG. 5B, the calibration of residue stage 234(1) in process block 502 adjusts null delay thresholds X and Y, for example to the ¼ FS and ¾ FS points of the input voltage range along curves 560 and 565, respectively. Curve 560 illustrates the relationship of residue delay for input voltage V in the range from 0 mV to ½ FS (sign bit D1=1), and curve 565 illustrates that relationship for input voltage V from ½ FS to FS (sign bit D1=0).

In this example, first residue stage 234(1) does not include trim circuits 430P, 430M in its delay comparator 260, but includes trim circuit 490 in its logic function 258 as described above relative to FIG. 4B. In some examples, calibration at logic function 258 of first residue stage 234(1) is sufficient to calibrate the ADC 200 at the ¼ FS and ¾ FS input voltage points. In this example, process block 502 includes DAC 265 applying a VDAC voltage at or near either ¼ FS or ¾ FS, and iteratively adjusting the capacitance of trim circuit 490 to arrive at a trim capacitance that nulls the output residue delay. The calibration in process block 502 of one of null delay thresholds X and Y will simultaneously calibrate the other, applying the same shift to both curves 560 and 565.

In this example, residue stage 234(2) is constructed as described above relative to FIG. 4A and FIG. 4B, such that its delay comparator 260 includes the two trim circuits 430P, 430M. Accordingly, as described above, residue stage 234(2) may be independently calibrated for the case in which the transition at its input line A1 leads that at line B1 (sign bit D2=0), and for the case in which the transition at line A1 lags that at line B1 (sign bit D2=1).

Accordingly, calibration of second residue stage 234(2) is performed in process block 504 at two values of calibration voltage VDAC, for example at or near ⅛ FS and at or near ⅜ FS. Referring to FIG. 5B, process block 504 will operate separately to calibrate null delay threshold A on residue curve 570 applicable to input voltages in range R1 (e.g., below ¼ FS) and to calibrate null delay threshold B on residue curve 572 for input voltages in range R2 (e.g., between about ¼ FS and ½ FS). In process block 504, therefore, digital circuitry 240 may cause DAC 265 to apply VDAC at or near ⅛ FS, and iteratively adjust the capacitance of trim circuit 430M in delay comparator 260 (and, if desired, trim circuit 490 in logic function 258) to arrive at a trim setting at which the output residue delay is nulled for that applied VDAC voltage. This calibration of residue stage 234(2) for null delay threshold A on curve 570 in range R1 will at the same time calibrate null delay threshold D along curve 576 for range R4 (e.g., at about ⅞ FS in FIG. 5B), because residue stage 234(2) also receives a negative input residue delay for input voltages V in this range R4.

Also in process block 504, digital circuitry 240 causes DAC 265 to apply VDAC at or near ⅜ FS to calibrate the response of residue stage 234(2) for input voltage range R2. Similarly, digital circuitry 240 operates to iteratively adjust the capacitance of trim circuit 430P of delay comparator 260 (and, if desired, trim circuit 490 in logic function 258) to null the output residue delay at that applied VDAC. This calibration of residue stage 234(2) for null delay threshold B on curve 572 in range R2 will at the same time calibrate null delay threshold C along curve 574 for range R3 (e.g., at about ⅝ FS in FIG. 5B), because residue stage 234(2) also receives a positive input residue delay for input voltages V in this range R3. Alternatively, of course, calibration process block 504 may be performed for null delay threshold B at a VDAC voltage at or near ⅝ FS, which would at the same time calibrate for the ⅜ FS null delay threshold A.

In process block 506, calibration of third residue stage 234(3) in the sequence is performed, in similar manner as described above for calibration process 504 applied to residue stage 234(2). In this process block 506, calibration of third residue stage 234(3) is performed separately and independently at VDAC voltages corresponding to 1/16 FS and 3/16 FS, shown as null delay thresholds M and N in FIG. 5B. Similarly, calibration of null delay threshold M at about 1/16 FS, for input voltages in range R5, is performed by applying the appropriate VDAC voltage from DAC 265 and iteratively adjusting the capacitance of trim circuit 430M in delay comparator 260 of residue stage 234(3) (and, if desired, trim circuit 490 in its logic function 258) to null the output residue delay. Calibration of null delay threshold M in range R5 will at the same time adjust the response of residue stage 234(3) in input voltage ranges R8, R9, and R12; alternatively, calibration process block 506 may be applied using a VDAC voltage in one of those ranges.

Calibration process block 506 also includes calibration of residue stage 234(3) for null delay threshold N at about 3/16 FS, for input voltages in range R6, by applying the appropriate VDAC voltage from DAC 265 and iteratively adjusting the capacitance of trim circuit 430P in delay comparator 260 of residue stage 234(3) (and, if desired, trim circuit 490 in its logic function 258) to null the output residue delay. Calibration of null delay threshold N in range R6 will at the same time adjust the response of residue stage 234(3) in input voltage ranges R7, R10, and R11; alternatively, calibration process block 506 may be applied using a VDAC voltage in one of those ranges.

Calibration of the remaining residue stages 234(4), . . . 234(j) may then be performed in a similar manner in process 508. In some examples, calibration of these later residue stages 234(4), . . . 234(j) in the sequence is performed only by adjusting trim circuit 490 in logic function 258 of those stages, considering that the sign bits determined at these later stages are in less significant places of the digital output word DOUT. Different implementations of ADC according to these examples may include delay comparators with independent trim circuits, such as described above relative to FIG. 4A, and calibration of those delay comparators such as in process blocks 504, 506, in more or fewer residue stages than that described in this example, depending upon the level of precision desired for the ADC.

Following calibration of the later residue stages 234(4), . . . 234(j) in process block 508, calibration of TDC component 230 in ADC 200 is completed. Return of ADC 200 to normal conversion of received input samples, for example by digital circuitry issuing the appropriate select signal to multiplexer 214 via line 268, is then performed in process block 510.

According to this example, improvement in the error performance of delay-domain ADCs can be attained. Plot 600 of FIG. 6 illustrates integral non-linearity performance from ADC 200 according to this example over full scale FS, as obtained via simulation, as compared with that of the conventional calibration approach shown by plot 350 from FIG. 3C. As evident from plot 600, by separately and independently calibrating residue stage 234 both in input voltage range R1 and in input voltage range R2, the non-linearity over each range can be optimized without degrading error performance in the other. Overall improvement in the linearity and thus accuracy of delay-domain ADCs can thus be attained.

As described above for the calibration of residue stage 234(3), the calibration of ADC 200 at null delay threshold M in range R5 at the same time adjusts the response of residue stage 234(3) in input voltage ranges R8, R9, and R12. Similarly, calibration at null delay threshold N in range R6 at the same time adjusts the response of residue stage 234(3) in input voltage ranges R7, R10, and R11. Some non-linearity may remain over those voltage ranges (e.g., ranges R8, R9, R12) that are adjusted as a result of calibration at an input voltage in a different range (range R5). This remaining non-linearity may be further reduced according to an alternative implementation in which separate trim circuits within a residue stage may be selected for calibration according to the sign bit from a previous residue stage. An example of this alternative implementation is shown in FIGS. 7A and 7B.

Figure 7A:
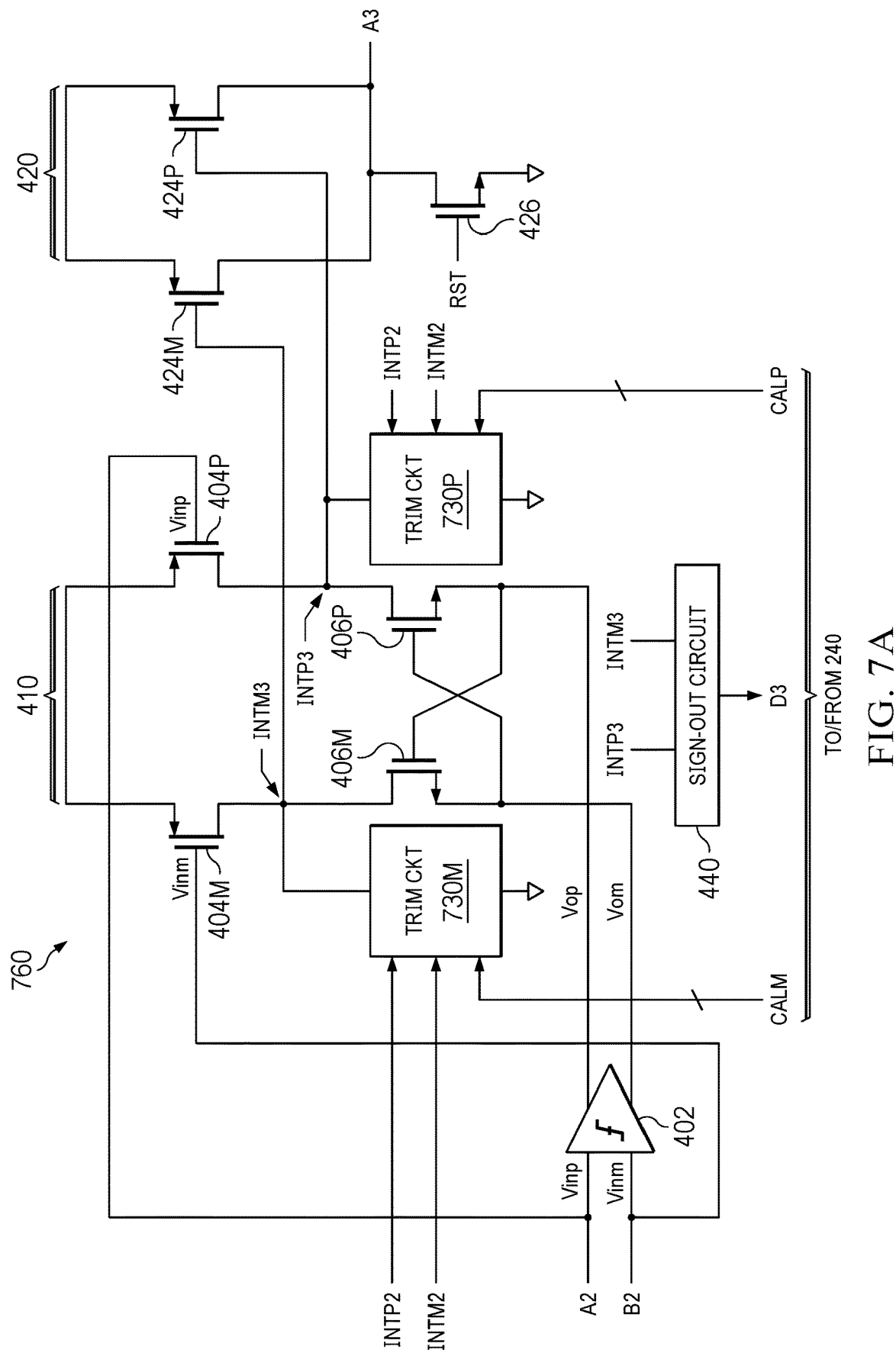
FIG. 7A is an electrical diagram, in schematic form, of another example delay comparator in a residue stage of an analog-to-digital converter of FIG. 2A.
Figure 7B:
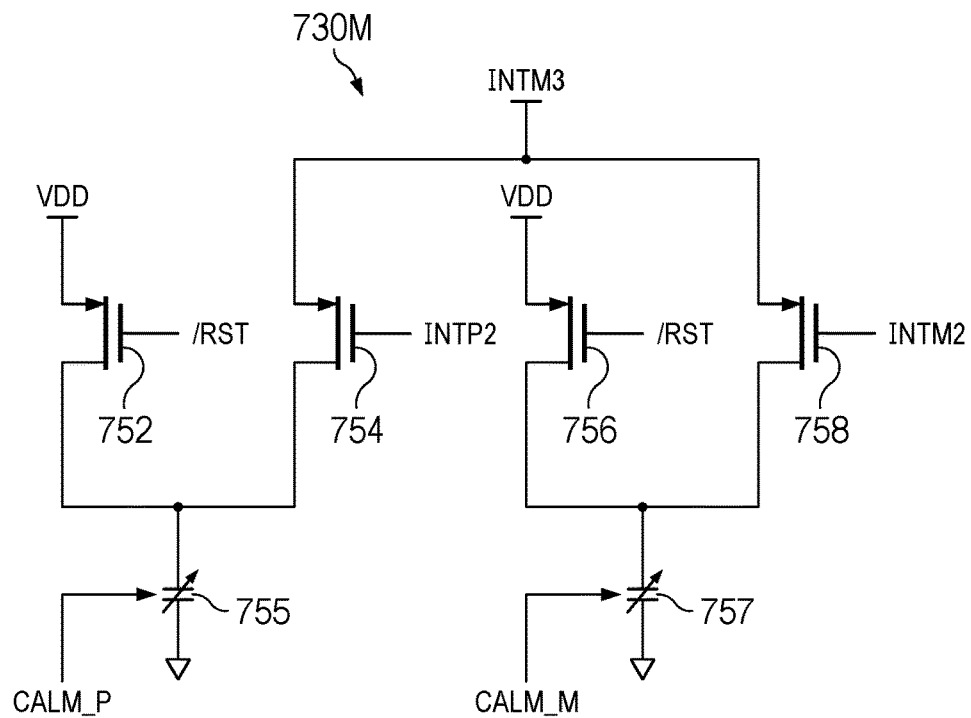
FIGS. 7B and 7C are electrical diagrams, in schematic form, of trim circuits in the delay comparator of FIG. 7A.

FIG. 7A illustrates an example of delay comparator 760 as incorporated into residue stage 234(3) according to this alternative implementation. Delay comparator 760 is constructed similarly as described above relative to delay comparator 260 in FIG. 4A, with the same reference numbers as used in FIG. 4A referring to the same corresponding circuits in FIG. 7A. As such, delay comparator 760 includes time-domain comparator 402, voltage barrier circuit 410, and output stage 420, each of which is constructed similarly as described above. In addition, residue stage 234(3) in this example also includes logic function 258 constructed and operable as described above relative to FIG. 4B.

In delay comparator 760 of residue stage 234(3), time-domain comparator 402 has its inputs Vinp, Vinm coupled to lines A2, B2, respectively, to receive a delay residue from residue stage 234(2). Time-domain comparator 402 issues a differential voltage at its outputs Vop, Vom in response to the delay between logic level transitions at inputs Vinp, Vinm.

Outputs Vop, Vom of time-domain comparator 402 are coupled to voltage barrier circuit 410, which in delay comparator 760 is constructed in the same manner as described above relative to FIG. 4A. In this example in which delay comparator 760 is implemented in residue stage 234(3), intermediate nodes INTP3, INTM3 in the two transistor legs of voltage barrier circuit 410 serve as the outputs of this stage, and are coupled to the gates of respective PMOS transistors 424P, 424M in output stage 420, as before. The drains of PMOS transistors 424P, 424M, and of NMOS reset transistor 426 in output stage 420 are coupled to residue signal line A3. In this example, sign-out circuit 440 generates sign bit output D3 based on the polarity of intermediate nodes INTP3, INTM3 from voltage barrier circuit 410 in the same manner as described above.

The operation of delay comparator 760 in the example of FIG. 7A to rising edge transitions at input residue signal lines A2, B2 follows that described above for delay comparator 260 of FIG. 4A.

According to this example, the response of delay comparator 760 in its driving of a transition at output line A3 relative to the delay between the transitions at input lines A2, B2 is calibrated separately and independently not only for both leading and lagging transitions at input line A2 relative to input line B2, but also for both values of sign bit D2 as determined at preceding residue stage 234(2). As shown in FIG. 7A, trim circuit 730P in delay comparator 760 is coupled between intermediate node INTP3 and circuit ground, and trim circuit 730M is coupled between intermediate node INTM3 and circuit ground. Trim circuit 730P in this example has inputs coupled to receive calibration signal lines CALP from digital circuitry 240, and also has inputs coupled to intermediate nodes INTP2, INTM from residue stage 234(2). Similarly, trim circuit 730M has inputs coupled to calibration signal lines CALM from digital circuitry 240, and inputs coupled to intermediate nodes INTP2, INTM from residue stage 234(2).

Figure 7C:
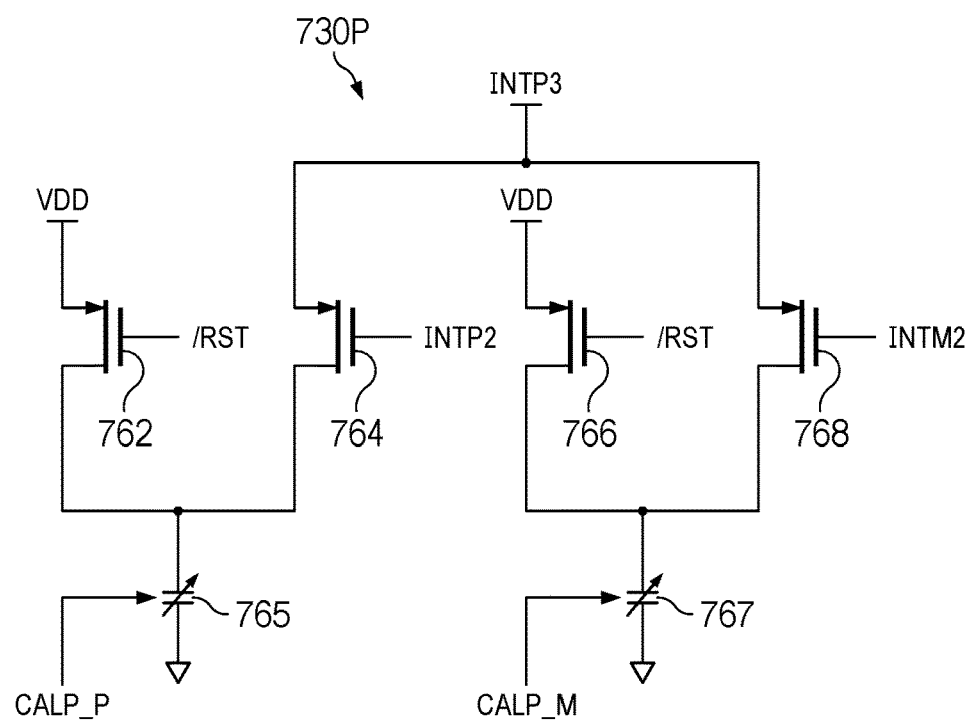

FIGS. 7B and 7C illustrate example trim circuits 730M, 730P. Trim circuit 730M of FIG. 7B includes two separately variable capacitors 755, 757, each implemented as a switched capacitor array to present a capacitance selected in response to digital calibration words from digital circuitry 240 communicated on lines CALM_P, CALM_M, respectively. Variable capacitor 755 is coupled between circuit ground and the drains of PMOS transistors 752, 754. PMOS transistor 752 has its source coupled to the VDD power supply and a gate receiving reset signal /RST (i.e., active at a low logic level). PMOS transistor 754 has its source coupled to intermediate node INTM3 and a gate coupled to intermediate node INTP2 of residue stage 234(2). Similarly, variable capacitor 757 is coupled between circuit ground and the drains of PMOS transistors 756, 758. PMOS transistor 756 has its source coupled to the VDD power supply and a gate receiving reset signal /RST. PMOS transistor 758 has its source coupled to intermediate node INTM3 and a gate coupled to intermediate node INTM2 of residue stage 234(2).

Similarly, trim circuit 730P of FIG. 7C includes two variable capacitors 765, 767 having a capacitance selected in response to digital calibration words from digital circuitry 240 communicated on lines CALP_P, CALP_M, respectively. Variable capacitor 765 is coupled between circuit ground and the drains of PMOS transistors 762, 764. PMOS transistor 762 has its source coupled to the VDD power supply and a gate receiving reset signal /RST, PMOS transistor 764 has its source coupled to intermediate node INTP3 and a gate coupled to intermediate node INTP2 of residue stage 234(2). Similarly, variable capacitor 767 is coupled between circuit ground and the drains of PMOS transistors 766, 768. PMOS transistor 766 has its source coupled to the VDD power supply and a gate receiving reset signal /RST. PMOS transistor 768 has its source coupled to intermediate node INTP3 and a gate coupled to intermediate node INTM2 of residue stage 234(2).

In both of trim circuits 730M, 730P, reset transistors 752, 756, 762, 766 are all turned on by reset signal /RST at an active low logic level. For example, digital circuitry 240 issues reset signal /RST between sample conversions. In each instance, the top plate of corresponding variable capacitors 755, 757, 765, 767 are biased to the VDD power supply voltage in preparation for each conversion operation by ADC 200, ensuring a constant initial condition at each sample conversion.

According to this example, the capacitance applied by trim circuit 730M to intermediate node INTM3 is that of variable capacitor 755 if intermediate node INTP2 in residue stage 234(2) is driven low and turns on transistor 754. This occurs in response to the input transition at line A2 leading that at line B2 (sign bit D2=0). Conversely, the capacitance applied by trim circuit to intermediate node INTM3 is that of variable capacitor 757 if intermediate node INTM2 in residue stage 234(2) is driven low and turns on transistor 758. This occurs in response to the input transition at line A2 lagging that at line B2 (sign bit D2=1). Similarly, the capacitance applied by trim circuit 730P to intermediate node INTP3 is that of variable capacitor 765 if intermediate node INTP2 in residue stage 234(2) is driven low (sign bit D2=0), and is that of variable capacitor 757 if intermediate node INTM2 in residue stage 234(2) is driven low (sign bit D2=1).

The capacitances of variable capacitors 755, 757, 765, 767 may be individually selected in response to calibration signals from digital circuitry 140, via signal lines CALM_P, CALM_M, CALP_P, CALP_M, respectively. Accordingly, the response of delay comparator 760 may be separately and independently calibrated for null delay thresholds of each combination of sign bits D2 and D3. In this example, the response of delay comparator 760 may be adjusted for each of these combinations as shown below in Table 1:

TABLE 1

| Variable capacitor | D2 value | D3 value | Input voltage range (FIG. 5B) | Calibration signal |
|---|---|---|---|---|
| 755 | 0 | 1 | R8, R9 | CALM_P |
| 757 | 1 | 1 | R5, R12 | CALM_M |
| 765 | 0 | 0 | R7, R10 | CALP_P |
| 767 | 1 | 0 | R6, R11 | CALP_M |

Figure 8:
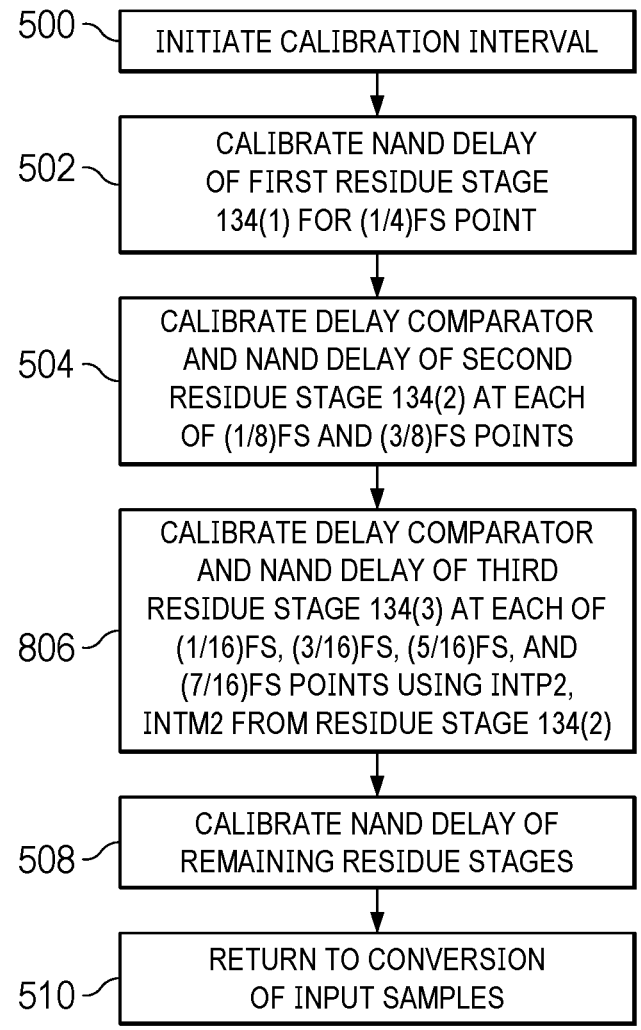
FIG. 8 is a flow diagram illustrating an example method of calibrating an analog-to-digital converter according to the example of FIGS. 7A through 7C.

FIG. 8 illustrates an example method of calibrating ADC 200 for a residue stage 234(3) constructed as described above relative to FIGS. 7A and 7B. The method of FIG. 8 includes process blocks 500-504, 806, 508, and 510. Some of the process blocks in the method shown in FIG. 8 in this example correspond to the same process blocks described above relative to FIG. 5A, and are referred to in FIG. 8 by way of the same reference numbers.

As such, calibration according to this example begins in process block 500 with the initiation by digital circuitry 240 of a calibration operation, For example, digital circuitry 240 provides a control signal on signal line 238 to multiplexer 214 to select calibration voltage VDAC on line 216 for application to pre-amplifier array 220 as analog voltage V. As before, the null delay threshold at ½ FS may not require calibration. As such, process block 502 is next performed to calibrate residue stage 234(1). Similarly as described above relative to FIG. 5A, the calibration of residue stage 234(1) in process block 502 adjusts the null delay thresholds at one of the ¼ FS and ¾ FS input voltages, for example by adjusting the delay of logic function 258 in that residue stage 234(1). The calibration in process block 502 of one of null delay thresholds at ¼ FS or ¾ FS will simultaneously calibrate the other.

Similarly as described above, residue stage 234(2) in this example is constructed as described above relative to FIG. 4A and FIG. 4B, such that its delay comparator 260 includes two trim circuits 430P, 430M. As such, calibration of second residue stage 234(2) is separately performed in process block 504 at two values of calibration voltage VDAC, for example at or near ⅛ FS and at or near ⅜ FS.

Calibration of residue stage 234(3) is then performed in process block 806 according to this example implementation. As described above, the construction of delay comparator 760 in residue stage 234(3) according to this example enables calibration at each of four null delay thresholds, for example at voltages corresponding to 1/16 FS (point M in FIG. 5B), 3/16 FS (point N), 5/16 FS (point P), and 7/16 FS (point Q). Process 806 thus performs these four calibration operations, in each case by applying the appropriate VDAC voltage from DAC 265 as the input voltage to V2D component 110, and iteratively adjusting the capacitance of the appropriate one of variable capacitors 755, 757, 765, 767 for that applied VDAC voltage (e.g., according to Table 1) to null the output residue delay from residue stage 234(3) at that voltage. As described above, each of these operations in process block 806 use the result of the sign bit D2 determination from preceding residue stage 234(2). Calibration at each of these four null delay thresholds operates to also adjust the null delay threshold in the corresponding input voltage ranges about ½ FS, as described above and shown in Table 1.

Calibration of the remaining residue stages 234(4), . . . 234(j) may then be performed in process 508. As described above, some implementations may permit calibration of these later residue stages 234(4), . . . 234(j) in the sequence may be performed only by adjusting trim circuit 490 in logic function 258 of those stages. Following calibration of the later residue stages 234(4), . . . 234(j) in process block 508, calibration of TDC component 230 in ADC 200 is completed. Return of ADC 200 to normal conversion of received input samples, for example by digital circuitry 240 issuing the appropriate select signal to multiplexer 214 via line 268, is then performed in process block 510.

Referring to FIG. 9, plot 900 illustrates the integral-non-linearity performance of over full scale FS, as obtained via simulation, as compared with that of the calibration approaches shown by plots 350 and 355 from FIG. 3C. The integral non-linearity performance shown by plot 900 is significantly improved by this example, in which the delay calibration of a residue stage is based on the sign bit result from the previous stage (e.g., communicated by coupling of the intermediate nodes INTP2, INTM2 into the trim circuits 730P, 730M). This approach enables a more granular calibration within the input voltage range, and thus better optimization of conversion error for the ADC, resulting in further improvement in the linearity and accuracy of delay-domain ADCs. Variations on the examples described above, such as forwarding of results from more than one preceding residue stage into the trim circuits of later stages, may also be incorporated as desired for a given system implementation.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some examples, certain elements are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications to the described embodiments, and other embodiments, are possible within the scope of the claims.

What is claimed is:

1. An analog-to-digital converter, comprising:
   a voltage-to-delay circuit having a voltage input and first and second outputs;
   a plurality of residue stages coupled in a sequence, comprising:
      a first residue stage, having a first input coupled to the first output of the voltage-to-delay circuit, a second input coupled to the second output of the voltage-to-delay circuit, a sign bit output presenting a signal indicating a polarity of a relative delay between transitions at of the first and second outputs of the voltage-to-delay circuit, and first and second residue outputs; and
      a second residue stage coupled to the first residue stage, and comprising:
         a logic gate having a first input coupled to the first residue output, a second input coupled to the second residue output, and a first residue output; and
         a delay comparator having a first input, a second input, a sign bit output, and a second residue output; and
   digital circuitry having inputs coupled to the outputs of the plurality of residue stages, and having one or more calibration outputs coupled to one or more residue stages;
   wherein the delay comparator comprises:
      a time-domain comparator configured to generate a differential voltage responsive to a delay between signals at the first and second inputs of the delay comparator;
      a voltage circuit coupled to receive the differential voltage from the time-domain comparator, and having first and second intermediate outputs;
      an output stage, comprising a first transistor having a conductive path coupled between a bias voltage and the second residue output and having a control terminal coupled to the first intermediate output of the voltage circuit, and a second transistor having a conductive path coupled between the bias voltage and the second residue output and having a control terminal coupled to the second intermediate output of the voltage circuit;
      a first trim circuit coupled to the first intermediate output of the voltage circuit, and an input coupled to the digital circuitry; and
      a second trim circuit coupled to the second intermediate output of the voltage circuit, and an input coupled to the digital circuitry.

2. The analog-to-digital converter of claim 1, wherein each of the first and second trim circuits comprises a variable capacitor configurable to a selected capacitance responsive to a calibration signal from the digital circuitry.

3. The analog-to-digital converter of claim 2, further comprising:
   a digital-to-analog converter, having an input coupled to the digital circuitry and an analog output; and
   an input multiplexer having a first input coupled to receive an input voltage, a second input coupled to the analog output of the digital-to-analog converter, a control input coupled to the digital circuitry, and an output coupled to the voltage input of the voltage to delay circuit;
   wherein the digital circuitry is configured to apply, in a calibration mode, a selected calibration voltage to the digital-to-analog converter and a control signal to the input multiplexer to select the analog output of the digital-to-analog converter.

4. The analog-to-digital converter of claim 3, wherein the digital circuitry is configured to, in the calibration mode, apply a calibration signal to the first trim circuit of the second residue stage for a selected calibration voltage in a first voltage range, and apply a calibration signal to the second trim circuit of the of the second residue stage for a selected calibration voltage in a second voltage range.

5. The analog-to-digital converter of claim 3, wherein the second residue stage further comprises:
   a third trim circuit coupled to the logic gate, the third trim circuit having an input coupled to the digital circuitry.

6. The analog-to-digital converter of claim 1, wherein the first residue stage has a plurality of sign bit outputs presenting a plurality of sign bits to the digital circuitry responsive to the delay magnitude of the first and second outputs of the voltage to delay circuit.

7. The analog-to-digital converter of claim 1, wherein the plurality of residue stages further comprises a third residue stage, the third residue stage comprising:
   a logic gate having a first input coupled to a first residue output of the second residue stage, a second input coupled to the second residue output of the second residue stage, and a first residue output; and
   a delay comparator having a first input coupled to a first residue output of the second residue stage, a second input coupled to the second residue output of the second residue stage, a sign bit output, and a second residue output, the delay comparator comprising:

a time-domain comparator configured to generate a differential voltage responsive to a delay between signals at the first and second inputs of the delay comparator;

a voltage circuit coupled to receive the differential voltage from the time-domain comparator, and having first and second intermediate outputs;

an output stage, comprising a first transistor having a conductive path coupled between a bias voltage and the second residue output and having a control terminal coupled to the first intermediate output of the voltage circuit, and a second transistor having a conductive path coupled between the bias voltage and the second residue output and having a control terminal coupled to the second intermediate output of the voltage circuit;

a first trim circuit coupled to the first intermediate output of the voltage circuit, and comprising:
  a first variable capacitor configurable to a selected capacitance responsive to a calibration signal from the digital circuitry;
  a second variable capacitor configurable to a selected capacitance responsive to a calibration signal from the digital circuitry; and
  a first select circuit, coupled to a previous residue stage in the sequence, and configured to couple the first variable capacitor to the first intermediate output if the digital output of the previous residue stage is at a first logic level, and to couple the second variable capacitor to the first intermediate output if the digital output of the previous residue stage is at a second logic level; and a second trim circuit coupled to the second intermediate output of the voltage circuit, and comprising:
  a third variable capacitor configurable to a selected capacitance responsive to a calibration signal from a calibration output of the digital circuitry;
  a fourth variable capacitor configurable to a selected capacitance responsive to a calibration signal from a calibration output of the digital circuitry; and
  a second select circuit, coupled to a previous residue stage in the sequence, and configured to couple the third variable capacitor to the second intermediate output if the digital output of the previous residue stage is at the first logic level, and to couple the fourth variable capacitor to the second intermediate output if the digital output of the previous residue stage is at the second logic level.

8. A method of calibrating an analog-to-digital converter, the method comprising:
  causing a voltage-to-delay device to generate a delay signal based on a calibration voltage;
  at a first residue stage:
    receiving the delay signal at an input;
    generating a sign bit based on the delay signal; and
    generating a residue delay signal based on the delay signal;
  at each of a plurality of successive residue stages:
    generating a sign bit based on the residue delay signal at its input; and
    providing a residue delay signal to an input of a next successive residue stage, based on the residue delay signal at its input; and
  adjusting one or more of the successive residue stages, the adjusting step comprising:
    adjusting a first response of the residue stage at a first intermediate output for a calibration voltage in a first range; and
    adjusting a second response of the residue stage at a second intermediate output for a calibration voltage in a second range.

9. The method of claim 8, wherein the residue delay signal at an output of a residue stage is a delay between transitions at first and second outputs of the residue stage;
  and wherein the step of providing a residue delay signal at each of the successive delay-based stages comprises:
    applying a logic function response to transitions at the first and second outputs of a previous residue stage to produce a transition at a first residue output; and
    generating a differential voltage responsive to a delay between the transitions at the first and second outputs of the previous residue stage;
    at a voltage circuit, driving an output voltage at one of the first and second intermediate outputs responsive to the differential voltage; and
    driving a second residue output responsive to the driving of the output voltage at one of the first and second delay comparator nodes;
  wherein the step of adjusting the first delay comprises adjusting a first variable capacitance coupled to the first intermediate output for a calibration voltage in the first range; and
  wherein the step of adjusting the second delay comprises adjusting a second variable capacitance coupled to the second intermediate output for a calibration voltage signal in the second range.

10. The method of claim 9, wherein the adjusting step further comprises:
  adjusting a delay in the logic function for a calibration voltage.

11. The method of claim 9, wherein the at least one of the successive residue stages is at least a second one in a sequence of the successive delay-based stages;
  wherein the step of adjusting the first delay comprises:
    adjusting the first variable capacitance coupled to the first intermediate output for the calibration voltage in the first range in combination if the sign bit from a previous residue stage is at a first logic level; and
    adjusting a third variable capacitance coupled to the first intermediate output for the calibration voltage in the first range in combination if the sign bit from a previous residue stage is at a second logic level; and
  and wherein the step of adjusting the second delay comprises:
    adjusting the second variable capacitance coupled to the second intermediate output for the calibration voltage in the second range in combination if the sign bit from a previous residue stage is at the first logic level; and
    adjusting a fourth variable capacitance coupled to the second intermediate output for the calibration voltage in the second range in combination if the sign bit from a previous residue stage is at the second logic level.

12. The method of claim 8, wherein the step of generating a digital signal at the first delay-based stage comprises generating a multi-bit digital signal.

13. An analog-to-digital converter, comprising:
  a voltage-to-delay circuit having a voltage input, and configured to generate signals at first and second outputs having a relative delay magnitude corresponding to a voltage at the voltage input;

a plurality of residue stages coupled in a sequence, comprising:
  a first residue stage, having a first input coupled to the first output of the voltage-to-delay circuit, a second input coupled to the second output of the voltage-to-delay circuit, one or more digital outputs presenting one or more bits responsive to the delay magnitude of the first and second outputs of the voltage-to-delay circuit, and first and second outputs presenting delay signals corresponding to a residue;
  one or more residue stages coupled in the sequence with the first residue stage, each residue stage comprising:
    a logic gate having a first input coupled to the first output of a previous residue stage in the sequence, a second input coupled to the second output of the previous residue stage in the sequence, and a first residue output; and
    a delay comparator having a first input coupled to the first output of the previous residue stage in the sequence, a second input coupled to the second output of the previous residue stage in the sequence, a sign bit output, and a second residue output;
  digital circuitry having inputs coupled to the digital outputs of the first residue stage and the sign bit output of each of the plurality of residue stages, and having one or more calibration outputs coupled to at least one of the residue stages;
  a digital-to-analog converter, having an input coupled to the digital circuitry and an analog output; and
  an input multiplexer having a first input coupled to receive an input voltage, a second input coupled to the analog output of the digital-to-analog converter, a control input coupled to the digital circuitry, and an output coupled to the voltage input of the voltage-to-delay circuit;
  wherein the digital circuitry is configured to apply, in a calibration mode, a selected calibration voltage to the digital-to-analog converter and a control signal to the input multiplexer to select the analog output of the digital-to-analog converter;
  wherein the delay comparator of the at least one of the residue stages coupled to calibration outputs of the digital circuitry comprises first and second trim circuits coupled to first and second intermediate nodes, each of the first and second trim circuits coupled to receive calibration signals from the digital circuitry in the calibration mode.

14. The analog-to-digital converter of claim 13, wherein the digital circuitry is configured to, in the calibration mode, apply a first calibration signal to the first trim circuit of the at least one of the residue stages for a selected calibration voltage in a first voltage range, and apply a second calibration signal to the second trim circuit of the at least one of the residue stages for a selected calibration voltage in a second voltage range.

15. The analog-to-digital converter of claim 14, wherein the delay comparator of the at least one of the residue stages comprises:
  time-domain comparator circuitry configured to generate a differential voltage responsive to a delay between signals at the first and second inputs of the delay comparator;
  a voltage circuit configured to drive a voltage at one of first and second intermediate outputs responsive to the differential voltage from the time-domain comparator circuitry; and
  an output stage, coupled to the first and second intermediate outputs, and configured to drive the second residue output responsive to the voltage driven at one of the first and second intermediate nodes.

16. The analog-to-digital converter of claim 13, wherein each of the first and second trim circuits comprises a variable capacitor configurable to a selected capacitance responsive to a calibration signal from a calibration output of the digital circuitry.

17. The analog-to-digital converter of claim 16, wherein each of the residue stages following the at least one residue stage further comprises:
  a third trim circuit coupled to the logic gate, the third trim circuit having an input coupled to a calibration output of the digital circuitry.

18. The analog-to-digital converter of claim 16, wherein the at least one of the residue stages coupled to calibration outputs of the digital circuitry is a third or subsequent residue stage in the sequence;
  wherein the first trim circuit comprises:
    a first variable capacitor configurable to a selected capacitance responsive to a calibration signal from a calibration output of the digital circuitry;
    a second variable capacitor configurable to a selected capacitance responsive to a calibration signal from a calibration output of the digital circuitry; and
    a first select circuit, coupled to a previous residue stage in the sequence, and configured to couple the first variable capacitor to the first intermediate node if the sign bit output of the previous residue stage is at a first logic level, and to couple the second variable capacitor to the first intermediate node if the sign bit output of the previous residue stage is at a second logic level;
  and wherein the second trim circuit comprises:
    a third variable capacitor configurable to a selected capacitance responsive to a calibration signal from a calibration output of the digital circuitry;
    a fourth variable capacitor configurable to a selected capacitance responsive to a calibration signal from a calibration output of the digital circuitry; and
    a second select circuit, coupled to a previous residue stage in the sequence, and configured to couple the third variable capacitor to the second intermediate node if the sign bit output of the previous residue stage is at the first logic level, and to couple the fourth variable capacitor to the second intermediate node if the sign bit output of the previous residue stage is at the second logic level.

19. The analog-to-digital converter of claim 18, wherein each of the residue stages following the at least one residue stage further comprises:
  a third trim circuit coupled to the logic gate, the third trim circuit having an input coupled to a calibration output of the digital circuitry.

* * * * *